(12) United States Patent
Yu et al.

(10) Patent No.: US 9,312,184 B2
(45) Date of Patent: Apr. 12, 2016

(54) SEMICONDUCTOR DEVICES AND METHODS OF MANUFACTURING THE SAME

(71) Applicants: Tea-Kwang Yu, Hwaseong-si (KR); Bae-Seong Kwon, Bucheon-si (KR); Yong-Tae Kim, Yongin-si (KR); Chul-Ho Chung, Hwaseong-si (KR); Yong-Suk Choi, Hwaseong-si (KR)

(72) Inventors: Tea-Kwang Yu, Hwaseong-si (KR); Bae-Seong Kwon, Bucheon-si (KR); Yong-Tae Kim, Yongin-si (KR); Chul-Ho Chung, Hwaseong-si (KR); Yong-Suk Choi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 92 days.

(21) Appl. No.: 14/200,274

(22) Filed: Mar. 7, 2014

(65) Prior Publication Data

US 2014/0264538 A1 Sep. 18, 2014

(30) Foreign Application Priority Data

Mar. 15, 2013 (KR) ........................ 10-2013-0027775

(51) Int. Cl.
| | |
|---|---|
| H01L 21/8234 | (2006.01) |
| H01L 29/66 | (2006.01) |
| H01L 27/115 | (2006.01) |
| H01L 29/423 | (2006.01) |
| H01L 29/788 | (2006.01) |

(52) U.S. Cl.
CPC ..... *H01L 21/823462* (2013.01); *H01L 21/823456* (2013.01); *H01L 27/11546* (2013.01); *H01L 29/42324* (2013.01); *H01L 29/66825* (2013.01); *H01L 29/7881* (2013.01)

(58) Field of Classification Search
None
See application file for complete search history.

(56) References Cited

U.S. PATENT DOCUMENTS

| | | | |
|---|---|---|---|
| 5,674,762 A | 10/1997 | See et al. | |
| 7,960,786 B2 | 6/2011 | Huang et al. | |
| 7,972,929 B2 | 7/2011 | Lee | |
| 8,115,253 B2 | 2/2012 | Tang et al. | |
| 2006/0091444 A1* | 5/2006 | Shone | H01L 27/11521 257/314 |
| 2007/0128810 A1 | 6/2007 | Kao | |
| 2010/0308420 A1 | 12/2010 | Usujima et al. | |

FOREIGN PATENT DOCUMENTS

| | | |
|---|---|---|
| KR | 20070065001 A | 6/2007 |
| KR | 20100008784 A | 1/2010 |
| KR | 20110039742 A | 4/2011 |
| KR | 20110048195 A | 5/2011 |

* cited by examiner

*Primary Examiner* — Bilkis Jahan
*Assistant Examiner* — Kevin Quinto
(74) *Attorney, Agent, or Firm* — Harness, Dickey & Pierce, P.L.C.

(57) ABSTRACT

In a method of manufacturing a semiconductor device, a split gate structure is formed on a cell region of a substrate including the cell region and a logic region. The logic region has a high voltage region, an ultra high voltage region and a low voltage region, and the split gate structure includes a first gate insulation layer pattern, a floating gate, a tunnel insulation layer pattern and a control gate. A spacer layer is formed on the split gate structure and the substrate. The spacer layer is etched to form a spacer on a sidewall of the split gate structure and a second gate insulation layer pattern on the ultra high voltage region of the substrate. A gate electrode is formed on each of the high voltage region of the substrate, the second gate insulation layer pattern, and the low voltage region of the substrate.

18 Claims, 16 Drawing Sheets

2nd DIRECTION
⊗——1st DIRECTION

2nd DIRECTION
⊗——1st DIRECTION

2nd DIRECTION
⊗——1st DIRECTION

2nd DIRECTION
⊗——1st DIRECTION

2nd DIRECTION
⊗——1st DIRECTION

2nd DIRECTION
⊗——1st DIRECTION

SEMICONDUCTOR DEVICES AND METHODS OF MANUFACTURING THE SAME

CROSS-REFERENCE TO RELATED APPLICATION

This application claims priority under 35 U.S.C. §119 to Korean Patent Application No. 10-2013-0027775, filed on Mar. 15, 2013 in the Korean Intellectual Property Office (KIPO), the contents of which are herein incorporated by reference in their entirety.

BACKGROUND

1. Field

Example embodiments relate to semiconductor devices and/or methods of manufacturing the same. More particularly, example embodiments relate to flash memory devices having both of a cell region and a logic region, and/or methods of manufacturing the same.

2. Description of the Related Art

In a flash memory device, a method of forming both cell elements and logic elements has been developed. Next-generation touch IC products may not be driven only by a voltage of high voltage (HV) elements in a logic region, and thus ultra high voltage (UHV) elements are also needed in the logic region. The UHV elements use a gate insulation layer having a large thickness, which may be important for the characteristics of the UHV elements. Thus, a demand exists for a method of manufacturing a flash memory device in which a gate insulation layer of UHV elements may be formed to have a large thickness in relation to forming cell elements.

SUMMARY

At least one example embodiment provides a method of manufacturing a flash memory device having both of a cell region and a logic region.

At least one example embodiment provides a flash memory device having both of a cell region and a logic region.

According to at least one example embodiment, there is provided a method of manufacturing a semiconductor device. In the method, a split gate structure is formed on a cell region of a substrate including the cell region in which memory cells are formed and a logic region in which logic elements are formed. The logic region has a high voltage region, an ultra high voltage region and a low voltage region, and the split gate structure includes a first gate insulation layer pattern, a floating gate, a tunnel insulation layer pattern and a control gate. A spacer layer is formed on the split gate structure and the substrate. The spacer layer is etched to form a spacer on a sidewall of the split gate structure and a second gate insulation layer pattern on the ultra high voltage region of the substrate. A gate electrode is formed on each of the high voltage region of the substrate, the second gate insulation layer pattern, and the low voltage region of the substrate.

In at least one example embodiment, before forming the gate electrode, a third gate insulation layer pattern may be further formed on each of the high voltage region of the substrate and the second gate insulation layer pattern.

In at least one example embodiment, after forming the third gate insulation layer pattern, a fourth gate insulation layer pattern may be further formed on each of the third gate insulation layer pattern in the high voltage region, the third gate insulation layer pattern in the ultra high voltage region, and the low voltage region of the substrate.

In at least one example embodiment, when the split gate structure is formed, a first gate insulation layer and a floating gate layer may be sequentially formed on the substrate. The floating gate layer and the first gate insulation layer may be patterned to form the first gate insulation layer pattern and the floating gate sequentially stacked on the cell region of the substrate. A tunnel insulation layer and a control gate layer may be sequentially formed on the substrate to cover the first gate insulation layer pattern and the floating gate. The control gate layer and the tunnel insulation layer may be patterned.

In at least one example embodiment, when the floating gate layer and the first gate insulation layer are patterned, a first mask may be formed to expose a portion of the floating gate layer overlapping the cell region of the substrate. The exposed portion of the floating gate layer may be oxidized to form an oxide layer. A second mask may be formed on a sidewall of the first mask to partially cover the oxide layer. The oxide layer may be etched using the second mask as an etching mask to form an oxide layer pattern. The first and second masks may be removed. The floating gate layer and the first gate insulation layer may be etched using the oxide layer pattern as an etching mask.

In at least one example embodiment, before forming the first gate insulation layer and the floating gate layer, impurities may be doped at an upper portion of the substrate in the ultra high voltage region.

In at least one example embodiment, when the gate electrode is formed, a gate electrode layer may be formed on the split gate structure, the spacer, the second gate insulation layer pattern and the substrate. The gate electrode layer may be patterned.

In at least one example embodiment, the first gate insulation layer pattern, the tunnel insulation layer pattern and the spacer layer may be formed to include silicon oxide, and the floating gate, the control gate and the gate electrode may be formed to include doped polysilicon.

According to at least one example embodiment, there is provided a semiconductor device. The semiconductor device includes a split gate structure, a spacer, a second gate structure, a third gate structure and a fourth gate structure. The split gate structure is formed on a cell region of a substrate including the cell region in which memory cells are formed and a logic region in which logic elements are formed. The logic region having a high voltage region, an ultra high voltage region and a low voltage region. The split gate structure includes a first gate insulation layer pattern, a floating gate, a tunnel insulation layer pattern and a control gate sequentially stacked. The spacer is formed on a sidewall of the split gate structure. The second gate structure includes a second gate insulation layer pattern structure having a first thickness and a gate electrode sequentially stacked on the high voltage region of the substrate. The third gate structure includes a third gate insulation layer pattern structure having a second thickness and the gate electrode sequentially stacked on the ultra high voltage region of the substrate. The fourth gate structure includes a fourth gate insulation layer pattern structure having a third thickness and the gate electrode sequentially stacked on the low voltage region of the substrate. The spacer includes a material substantially the same as that of the third gate insulation layer pattern structure. The second thickness is greater than the first thickness and the first thickness is greater than the third thickness.

In at least one example embodiment, the fourth gate insulation layer pattern structure may include a fourth gate insulation layer pattern, the second gate insulation layer pattern structure may include a third gate insulation layer pattern and the fourth gate insulation layer pattern sequentially stacked, and the third gate insulation layer pattern structure may include a second gate insulation layer pattern, the third gate insulation layer pattern and the fourth gate insulation layer pattern sequentially stacked.

In at least one example embodiment, the second, third and fourth gate insulation layer patterns may include silicon oxide.

In at least one example embodiment, the spacer may include a material substantially the same as that of the second gate insulation layer pattern.

In at least one example embodiment, the spacer and the second gate insulation layer pattern may include silicon oxide.

In at least one example embodiment, the spacer and the second gate insulation layer pattern may include silicon nitride, and the third and fourth gate insulation layer patterns may include silicon oxide.

In at least one example embodiment, the split gate structure may include a pair of first gate structures each of which includes the first gate insulation layer pattern, the floating gate, the tunnel insulation layer pattern and the control gate. The spacer may be formed on an outer sidewall of each first gate structure.

According to at least one example embodiment, there is provided a method of manufacturing a semiconductor device. In the method, a pair of first gate structures is formed on a cell region of a substrate including the cell region in which memory cells are formed and a logic region in which logic elements are formed. The logic region has a high voltage region, an ultra high voltage region and a low voltage region. Each first gate structure includes a first gate insulation layer pattern, a floating gate, a dielectric layer pattern, a control gate and a hard mask. A spacer layer is formed on the pair of first gate structures and the substrate. The spacer layer is etched to form a spacer on a sidewall of each first gate structure and a second gate insulation layer pattern on the ultra high voltage region of the substrate. A tunnel insulation layer is formed on the pair of first gate structures, the spacer, the second gate insulation layer pattern and the substrate. The tunnel insulation layer is etched to form a tunnel insulation layer pattern and a third gate insulation layer pattern. The tunnel insulation layer pattern is formed on an inner sidewall of each first gate structure and a portion of the substrate between the pair of first gate structures, and the third gate insulation layer pattern is formed on each of the high voltage region of the substrate and the second gate insulation layer pattern. A word line is formed on an outer sidewall of each first gate structure and a gate electrode is formed on each of the third gate insulation layer pattern and the low voltage region of the substrate.

In at least one example embodiment, when the word line and the gate electrode are formed, an erase gate is formed between the pair of first gate structures.

In at least one example embodiment, before forming the word line and the gate electrode, a fourth gate insulation layer pattern may be further formed on each third gate insulation layer pattern.

In at least one example embodiment, after the fourth gate insulation layer pattern is formed, a fifth gate insulation layer pattern may be further formed on each of the tunnel insulation layer pattern, the fourth gate insulation layer pattern, and the low voltage region of the substrate.

In at least one example embodiment, before forming the tunnel insulation layer, a portion of the spacer on the inner sidewall of each first gate structure may be removed. An impurity region may be formed at an upper portion of the substrate between the pair of first gate structures. An upper portion of the impurity region may be thermally oxidized to form an oxide layer.

In at least one example embodiment, before forming the pair of first gate structures, impurities may be doped at an upper portion of the substrate in the ultra high voltage region.

According to at least one example embodiment, there is provided a semiconductor device. The semiconductor device includes a split gate structure, a second gate structure, a third gate structure and a fourth gate structure. The split gate structure includes a pair of first gate structures, a tunnel insulation layer pattern, a spacer, a word line and an erase gate. The pair of first gate structures is formed on a cell region of a substrate including the cell region in which memory cells are formed and a logic region in which logic elements are formed. The logic region has a high voltage region, an ultra high voltage region and a low voltage region. Each first gate structure includes a first gate insulation layer pattern, a floating gate, a dielectric layer pattern, a control gate and a hard mask sequentially stacked. The tunnel insulation layer pattern is formed on an inner sidewall of each first gate structure and a portion of the substrate between the pair of first gate structures. The word line contacts the spacer. The erase gate is formed on the tunnel insulation layer pattern between the pair of first gate structures. The second gate structure includes a second gate insulation layer pattern structure having a first thickness and a gate electrode sequentially stacked on the high voltage region of the substrate. The third gate structure includes a third gate insulation layer pattern structure having a second thickness and the gate electrode sequentially stacked on the ultra high voltage region of the substrate. The fourth gate structure includes a fourth gate insulation layer pattern structure having a third thickness and the gate electrode sequentially stacked on the low voltage region of the substrate. The spacer includes a material substantially the same as that of the third gate insulation layer pattern structure. The second thickness is greater than the first thickness and the first thickness is greater than the third thickness.

In at least one example embodiment, the fourth gate insulation layer pattern structure may include a fifth gate insulation layer pattern, the second gate insulation layer pattern structure may include a third gate insulation layer pattern, the fourth gate insulation layer pattern and the fifth gate insulation layer pattern sequentially stacked, and the third gate insulation layer pattern structure may include a second gate insulation layer pattern, the third gate insulation layer pattern, the fourth gate insulation layer pattern and the fifth gate insulation layer pattern sequentially stacked.

In at least one example embodiment, the spacer may include a material substantially the same as that of the second gate insulation layer pattern, and the tunnel insulation layer pattern may include a material substantially the same as that of the fourth gate insulation layer pattern.

In at least one example embodiment, an impurity region may be formed at an upper portion of the substrate between the pair of first gate structure, and the semiconductor device may further include an oxide layer between the impurity region and the tunnel insulation layer pattern.

According to at least one example embodiment, in a method of semiconductor device including a cell region in which a split gate structure is formed and a logic region having a high voltage region, an ultra high voltage region and a low voltage region, gate insulation layer pattern structures formed in the high voltage region, the ultra high voltage region and the low voltage region may have different compositions from one another, and may be easily formed to have required thicknesses according to voltages applied thereto.

According to at least one example embodiment, there is provided a semiconductor device including: a split gate structure on a cell region of a substrate including the cell region and a logic region, the split gate structure including a first gate insulation layer pattern, a floating gate, and a control gate that are stacked sequentially; a spacer on a sidewall of the split gate structure; a second gate structure including a second gate insulation layer pattern structure and a gate electrode stacked sequentially on a high voltage portion of the logic region; a third gate structure including a third gate insulation layer pattern structure and the gate electrode stacked sequentially on an ultra high voltage portion of the logic region, the third insulation layer pattern structure being formed of a same material as the spacer; and a fourth gate structure including a fourth gate insulation layer pattern structure and the gate electrode stacked sequentially on a low voltage portion of the logic region.

The thicknesses of the second gate insulation layer pattern structure, the third insulation layer pattern structure and the fourth insulation layer pattern structure may be different. The second gate insulation layer pattern structure may have a first thickness, the third gate insulation layer pattern structure may have a second thickness, and the fourth gate insulation layer pattern structure may have a third thickness. The second thickness may be greater than the first thickness and the first thickness may be greater than the third thickness.

The fourth gate insulation layer pattern structure may include a fourth gate insulation layer pattern, the second gate insulation layer pattern structure may include a third gate insulation layer pattern and the fourth gate insulation layer pattern stacked sequentially, and the third gate insulation layer pattern structure may include a second gate insulation layer pattern, the third gate insulation layer pattern and the fourth gate insulation layer pattern stacked sequentially.

The split gate structure may include a pair of first gate structures. Each of the first gate structures may include the first gate insulation layer pattern, the floating gate, a dielectric layer pattern, the control gate, and a hard mask stacked sequentially. The spacer may be formed on an outer sidewall of each of the first gate structures.

According to at least one example embodiment, there is provided a method of manufacturing a semiconductor device, comprising: forming a split gate structure on a cell region of a substrate including the cell region and a logic region, the split gate structure including a first gate insulation layer pattern, a floating gate, and a control gate that are stacked sequentially; concurrently forming a spacer and a second gate insulation layer pattern, the spacer being formed on a sidewall of the split gate structure, and the second gate insulation layer pattern being formed on an ultra high voltage portion of the logic region; and forming a gate electrode on a high voltage portion of the logic region, the second gate insulation layer pattern, and a low voltage portion of the logic region.

The method may further include: forming a third gate insulation layer pattern on the high voltage portion of the logic region and on the second gate insulation layer pattern in the ultra high voltage portion of the logic region.

The method may further include: forming a fourth gate insulation layer pattern on the third gate insulation layer pattern in the high voltage portion of the logic region, the third gate insulation layer pattern in the ultra high voltage portion of the logic region, and on the low voltage portion of the logic region.

The forming the split gate structure may include: forming a pair of first gate structures on the cell region of the substrate, each of the first gate structures including the first gate insulation layer pattern, the floating gate, a dielectric layer pattern, the control gate and a hard mask.

The concurrently forming the spacer layer and the second gate insulation layer pattern may include: forming a spacer layer on the split gate structure and the substrate; and concurrently etching the spacer layer to form the spacer and the second gate insulation layer pattern.

The gate insulation layer pattern structure in the ultra high voltage region may be formed to have a sufficiently thick thickness by a process for forming a spacer on a sidewall of the split gate structure in the cell region.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor device in accordance with at least one example embodiment;

FIGS. 2 to 15 are cross-sectional views illustrating stages of a method of manufacturing a semiconductor device in accordance with at least one example embodiment;

FIG. 16 is a cross-sectional view illustrating a semiconductor device in accordance with at least one example embodiment;

FIG. 17 is a cross-sectional view illustrating a semiconductor device in accordance with at least one example embodiment; and FIG. 18 is a top view illustrating the semiconductor device of FIG. 17;

FIGS. 19 to 31 are cross-sectional views illustrating stages of a method of manufacturing a semiconductor device in accordance with at least one example embodiment; and FIG. 32 is a cross-sectional view illustrating a semiconductor device in accordance with at least one example embodiment.

DETAILED DESCRIPTION

Figure 1:
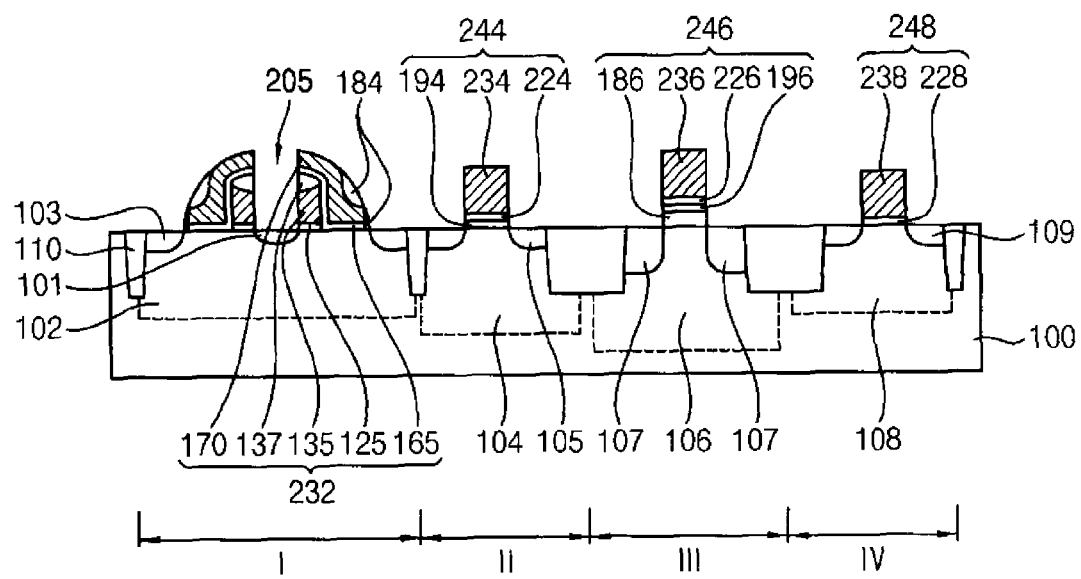
FIGS. 1 to 32 represent non-limiting, example embodiments as described herein.

Various example embodiments will be described more fully hereinafter with reference to the accompanying drawings, in which some example embodiments are shown. The inventive concepts may, however, be embodied in many different forms and should not be construed as limited to the example embodiments set forth herein. Rather, these example embodiments are provided so that this description will be thorough and complete, and will fully convey the scope of the inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concepts.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a semiconductor device in accordance with at least one example embodiment.

Referring to FIG. 1, the semiconductor device may include a split gate structure, a second spacer 184, and second, third and fourth gate structures 244, 246 and 248. The semiconductor device may further include first, second, third, fourth and fifth impurity regions 101, 103, 105, 107 and 109.

The substrate 100 may be a semiconductor substrate including a semiconductor material, e.g., silicon, germanium, etc., a silicon-on-insulator (SOI) substrate, a germanium-on-insulator (GOI) substrate, etc. The substrate 100 may include first, second, third and fourth regions I, II, III and IV. In at least one example embodiment, the first region I may be a cell region in which memory cells are formed, the second to fourth regions II, III and IV may be a logic region in which logic elements are formed. Particularly, the second region II may be a high voltage region, the third region III may be an ultra high voltage region, and the fourth region IV may be a low voltage region. A voltage less than about 5V may be applied to the low voltage region, a voltage in a range of about 5 to about 15V may be applied to the high voltage region, and a voltage greater than about 15V may be applied to the ultra high voltage region.

An isolation layer 110 may be formed on the substrate 100, and thus the substrate 100 may be divided into an active region and a field region. The isolation layer 110 in the third region III serving as the ultra high voltage region may have a wider width or a thicker thickness than those of the isolation layer 110 in the first, second and fourth regions I, II and IV serving as the cell region, the high voltage region, and the low voltage region, respectively.

First, second, third and fourth wells 102, 104, 106 and 108 may be formed at the substrate 100 in the first, second, third and fourth regions I, II, III and IV, respectively. The first to fourth wells 102, 104, 106 and 108 may be doped with n-type impurities of p-type impurities. In FIG. 1, the first to fourth regions I, II, III and IV have the first to fourth wells 102, 104, 106 and 108, respectively. Alternatively, each of the first to fourth regions I, II, III and IV may have two wells (not shown) doped with impurities having different conduction types from each other. That is, each of the first to fourth regions I, II, III and IV may include a negative-channel metal-oxide-semiconductor (NMOS) region having a well doped with p-type impurities and a positive-channel metal-oxide-semiconductor (PMOS) region having a well region doped with n-type impurities.

In at least one example embodiment, the split gate structure may include a pair of first gate structures 232 each of which may include a first gate insulation layer pattern 125, a floating gate 135, a tunnel insulation layer pattern 165 and a control gate 170 sequentially stacked on the substrate 100 in the first region I. Each first gate structure 232 may further include an oxide layer pattern 137 between the floating gate 135 and the tunnel insulation layer pattern 165.

The first gate insulation layer pattern 125 may be formed on the substrate 100 in the first region I, and may include, e.g., silicon oxide.

The floating gate 135 may be formed on the first gate insulation layer pattern 125, and may include, e.g., doped polysilicon or a metal.

The oxide layer pattern 137 may be formed on the floating gate 135. In an example embodiment, a first surface of one of the pair of oxide layer patterns 137 facing the other one of the pair of oxide layer patterns 137 may have a vertical length greater than that of a second surface of the one of the pair of oxide layer patterns 137 opposing the first surface thereof. The oxide layer pattern 137 may include, e.g., silicon oxide.

In at least one example embodiment, the tunnel insulation layer pattern 165 may be conformally formed on a sidewall of the first gate insulation layer pattern 125, a sidewall of the floating gate 135, the oxide layer pattern 137 and a portion of the substrate 100 in the first region I. Thus, a lower portion of the tunnel insulation layer pattern 165 may have an "L"-like shape. The tunnel insulation layer pattern 165 may include, e.g., silicon oxide.

The control gate 170 may be formed on the tunnel insulation layer pattern 165. As the lower portion of the tunnel insulation layer pattern 165 may have the "L"-like shape, a lower portion of the control gate 170 may have also an "L"-like shape. The control gate 170 may include, e.g., doped polysilicon or a metal.

In at least one example embodiment, each of the first gate structures 232 may extend in a second direction substantially parallel to a top surface of the substrate 100, and the first gate structures 232 may be spaced apart from each other in a first direction substantially parallel to the top surface of the substrate 100 and substantially perpendicular to the second direction.

The second spacer 184 may be formed on a sidewall of each first gate structure 232. When a first sidewall of one of the pair of first gate structures 232 facing the other one of the pair of first gate structures 232 is defined as an inner sidewall, and a second sidewall of the one of the pair of first gate structures 232 opposing the first sidewall thereof is defined as an outer sidewall, the second spacer 184 may be formed on the outer sidewall of each first gate structure 232. In at least one example embodiment, the second spacer 184 may be formed on an outer sidewall of the control gate 170, and further on an outer sidewall of the tunnel insulation layer pattern 165. The second spacer 184 may include, e.g., silicon oxide or silicon nitride.

The first and second impurity regions 101 and 103 may be formed at upper portions of the substrate 100 in the first region I adjacent to the split gate structure. Particularly, the first impurity region 101 may be formed at an upper portion of the substrate 100 between the first gate structures 232, and the second impurity region 103 may be formed at an upper portion of the substrate 100 adjacent to the outer sidewall of each first gate structure 232. The first and second impurity regions 101 and 103 may include impurities having a conduction type different from that of the first well 102. That is, in an NMOS region, the first and second impurity regions 101 and 103 may include n-type impurities, and in a PMOS region, the first and second impurity regions 101 and 103 may include p-type impurities.

The split gate structure and the first and second impurity regions 101 and 103 may form a transistor. For example, the first impurity region 101 may serve as a source region of the transistor, and the second impurity region 103 may serve as a drain region of the transistor.

The second gate structure 244 may include a second gate insulation layer pattern structure having a first thickness and a gate electrode 234 sequentially stacked on the substrate 100 in the second region II. In at least one example embodiment, the second gate insulation layer pattern structure may include a third gate insulation layer pattern 194 and a fourth gate insulation layer pattern 224 sequentially stacked on the substrate 100 in the second region II. For example, the third and fourth gate insulation layer patterns 194 and 224 may include silicon oxide.

The third impurity region 105 may be formed at an upper portion of the substrate 100 in the second region II adjacent to the second gate structure 244. The third impurity region 105 may include impurities having a conduction type different from that of the second well 104. That is, in an NMOS region, the third impurity region 105 may include n-type impurities, and in a PMOS region, the third impurity region 105 may include p-type impurities.

The third gate structure 246 may include a third gate insulation layer pattern structure having a second thickness and a gate electrode 236 sequentially stacked on the substrate 100 in the third region III. In at least one example embodiment, the third gate insulation layer pattern structure may include a second gate insulation layer pattern 186, a third gate insulation layer pattern 196 and a fourth gate insulation layer pattern 226 sequentially stacked on the substrate 100 in the third region III. In at least one example embodiment, the second gate insulation layer pattern 186 may include a material substantially the same as that of the second spacer 184, e.g., silicon oxide or silicon nitride. For example, the third and fourth gate insulation layer patterns 196 and 226 may include silicon oxide.

The fourth impurity region 107 may be formed at an upper portion of the substrate 100 in the third region III adjacent to the third gate structure 246. The fourth impurity region 107 may include impurities having a conduction type different from that of the third well 106. That is, in an NMOS region, the fourth impurity region 107 may include n-type impurities, and in a PMOS region, the fourth impurity region 107 may include p-type impurities.

The fourth gate structure 248 may include a fourth gate insulation layer pattern structure having a third thickness and a gate electrode 238 sequentially stacked on the substrate 100 in the fourth region IV. The third thickness may be lower than the first thickens. In at least one example embodiment, the fourth gate insulation layer pattern structure may include a fourth gate insulation layer pattern 228 on the substrate 100 in the fourth region IV. For example, the fourth gate insulation layer patterns 228 may include silicon oxide.

The fifth impurity region 109 may be formed at an upper portion of the substrate 100 in the fourth region IV adjacent to the fourth gate structure 248. The fifth impurity region 109 may include impurities having a conduction type different from that of the fourth well 108. That is, in an NMOS region, the fifth impurity region 109 may include n-type impurities, and in a PMOS region, the fifth impurity region 109 may include p-type impurities.

In the semiconductor device in accordance with at least one example embodiment, the second, third and fourth gate structures 244, 246 and 248 in the second, third and fourth regions II, III and IV to which a high voltage, an ultra high voltage and a low voltage, respectively, may be applied may include gate insulation layer pattern structures having compositions different from one another. That is, the second gate structure 244 may include the third and fourth gate insulation layer patterns 194 and 224, the third gate structure 246 may include the second, third and fourth gate insulation layer patterns 186, 196 and 226, and the fourth gate structure 248 may include the fourth gate insulation layer pattern 228. Thus, each of the second, third and fourth gate structures 244, 246 and 248 in the second, third and fourth regions II, III and IV, respectively, may have the gate insulation layer pattern structure having a required thickness according to the voltage applied to each region.

In the present embodiment, the fourth, second and third gate structures 248, 244 and 246 may include the fourth, second and third gate insulation layer pattern structures having single, double and triple layered structures, respectively, however, may not be limited thereto. That is, the fourth, second and third gate layer pattern structures may have more layers than one, two and three layers, respectively, if only the fourth, second and third gate layer pattern structures may have less layers in this order so as to have less thicknesses in this order.

In FIG. 1, only one split gate structure including the pair of first gate structures 232 is shown, however, a plurality of split gate structures may be formed in the first direction.

FIGS. 2 to 15 are cross-sectional views illustrating stages of a method of manufacturing a semiconductor device in accordance with at least one example embodiment. This method may be used in manufacturing the semiconductor device of FIG. 1, however, may not be limited thereto.

Figure 2:
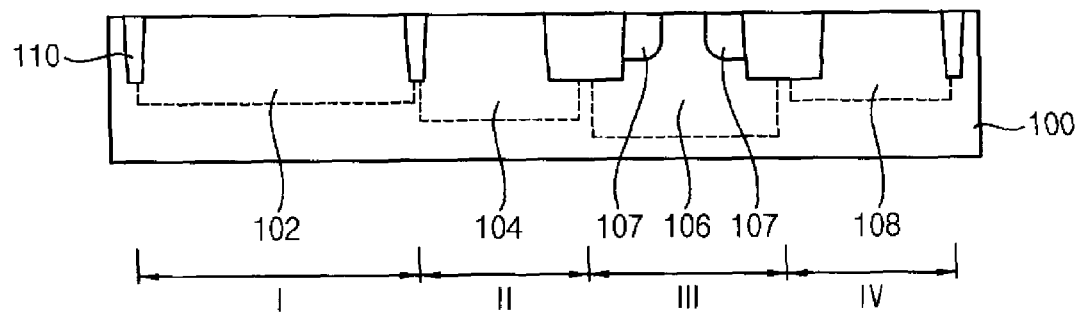

Referring to FIG. 2, an isolation layer 110 may be formed on a substrate 100, and first, second, third and fourth wells 102, 104, 106 and 108 may be formed at first, second, third and fourth regions I, II, III and IV of the substrate 100, respectively.

In at least one example embodiment, the isolation layer 110 may be formed by a shallow trench isolation (STI) process. The isolation layer 110 may be formed to have a wider width or a thicker thickness in the third region III serving as an ultra high voltage region than those in the first, second and fourth regions I, II and IV serving as a cell region, a high voltage region and a low voltage region, respectively.

In at least one example embodiment, the first to fourth wells 102, 104, 106 and 108 may be formed by implanting impurities onto the substrate 100. Thus, the first to fourth wells 102, 104, 106 and 108 may be doped with n-type impurities or p-type impurities. In FIG. 2, the first to fourth regions I, II, III and IV have the first to fourth wells 102, 104, 106 and 108, respectively, however, each of the first to fourth regions I, II, III and IV may have two wells (not shown) doped with impurities having different conduction types from each other.

Alternatively, the first to fourth wells 102, 104, 106 and 108 may be formed before forming the isolation layer 110.

Impurities may be implanted into an upper portion of the substrate 100 in the third region III using a first photoresist pattern (not shown) as an ion implantation mask to form a fourth impurity region 107. Thus, the fourth impurity region 107 may be formed in the ultra high voltage region before a gate electrode 236 (refer to FIG. 15) is formed therein, so that impurities may not penetrate through the gate electrode 236 due to the implantation process.

Figure 3:
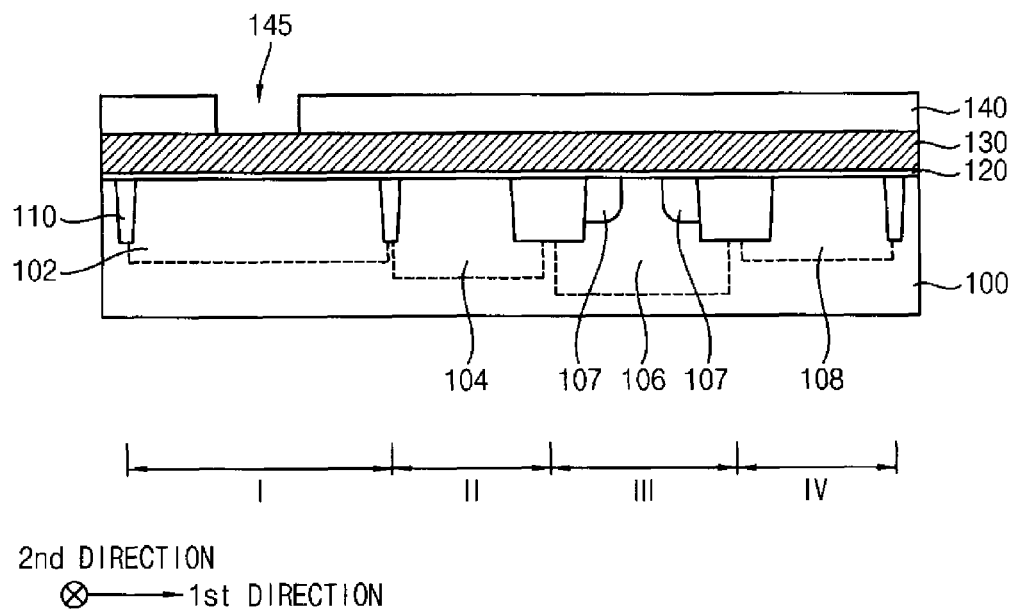

Referring to FIG. 3, a first gate insulation layer 120, a floating gate layer 130 and a first mask 140 may be sequentially formed on the substrate 100 having the isolation layer 110 thereon.

In at least one example embodiment, the first gate insulation layer 120 may be formed to include, e.g., silicon oxide by a chemical vapor deposition (CVD) process, an atomic layer deposition (ALD) process, a physical vapor deposition (PVD) process, etc. Alternatively, the first gate insulation layer 120 may be formed by a thermal oxidation process on an upper portion of the substrate 100.

The floating gate layer 130 may be formed to include doped polysilicon or a metal by a CVD process, an ALD process, a PVD process, etc.

The first mask 140 may be formed to include, e.g., silicon nitride by a CVD process, an ALD process, a PVD process, etc. The first mask 140 may be formed to have a first opening 145 exposing a portion of the floating gate layer 130 in the first region I. In at least one example embodiment, the first opening 145 may be formed to extend in a second direction substantially parallel to a top surface of the substrate 100.

Figure 4:
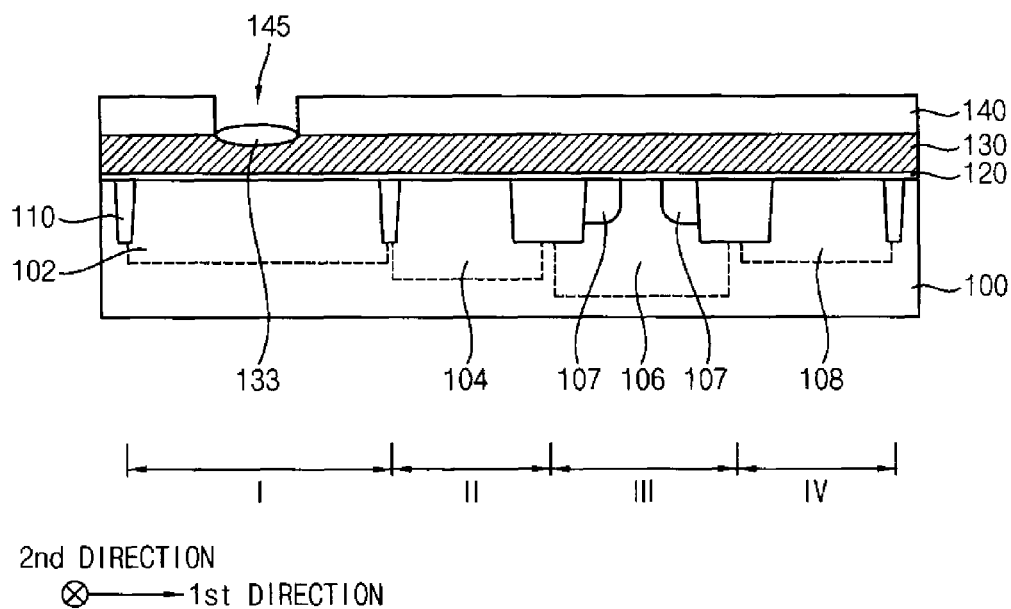

Referring to FIG. 4, the portion of the floating gate layer 130 exposed by the first opening 145 may be oxidized to form an oxide layer 133. The oxide layer 133 may extend in the second direction according to the shape of the first opening 145.

In at least one example embodiment, the oxide layer 133 may be formed by a thermal oxidation process on the exposed portion of the floating gate layer 130. Alternatively, the oxide layer 133 may be formed by a wet oxidation process using oxygen and hydrogen. In an example embodiment, the oxide layer 133 may be formed to have a convex shape.

Figure 5:
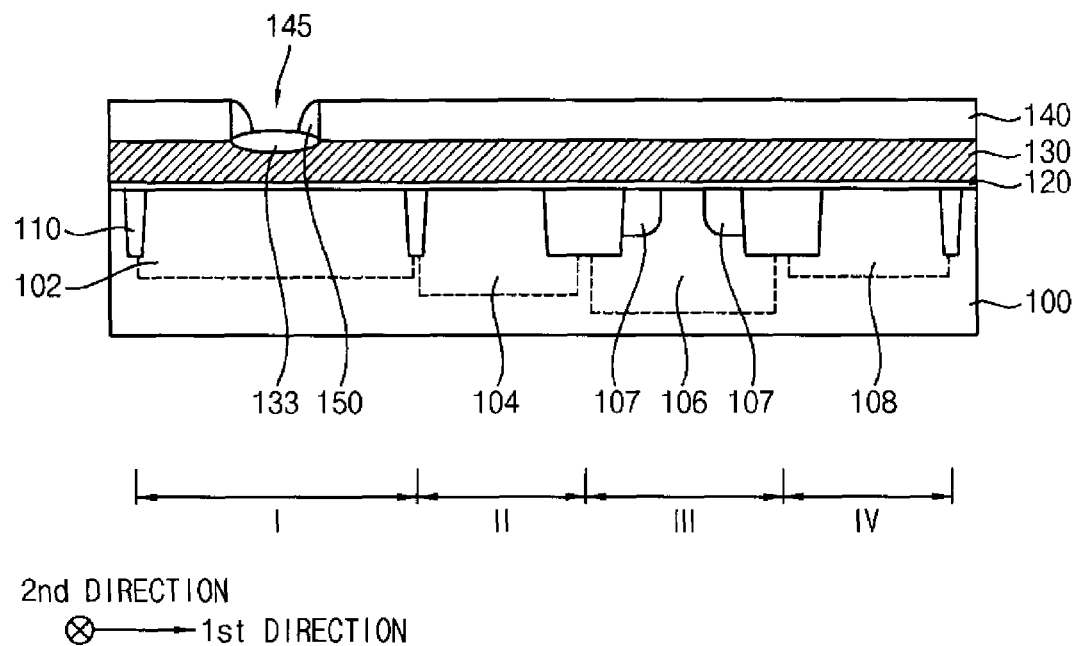

Referring to FIG. 5, a second mask 150 may be formed on a sidewall of the first mask 140 in the first opening 145 to partially cover the oxide layer 133.

In at least one example embodiment, a second mask layer may be formed to cover the oxide layer 133 and the first mask 140, and anisotropically etched to form the second mask 150 covering an edge portion of the oxide layer 133 on the sidewall of the first mask 140. Thus, the second mask 150 may be formed to extend in the second direction on each sidewall of the first mask 140. The second mask layer may be formed to include, e.g., silicon nitride.

Figure 6:
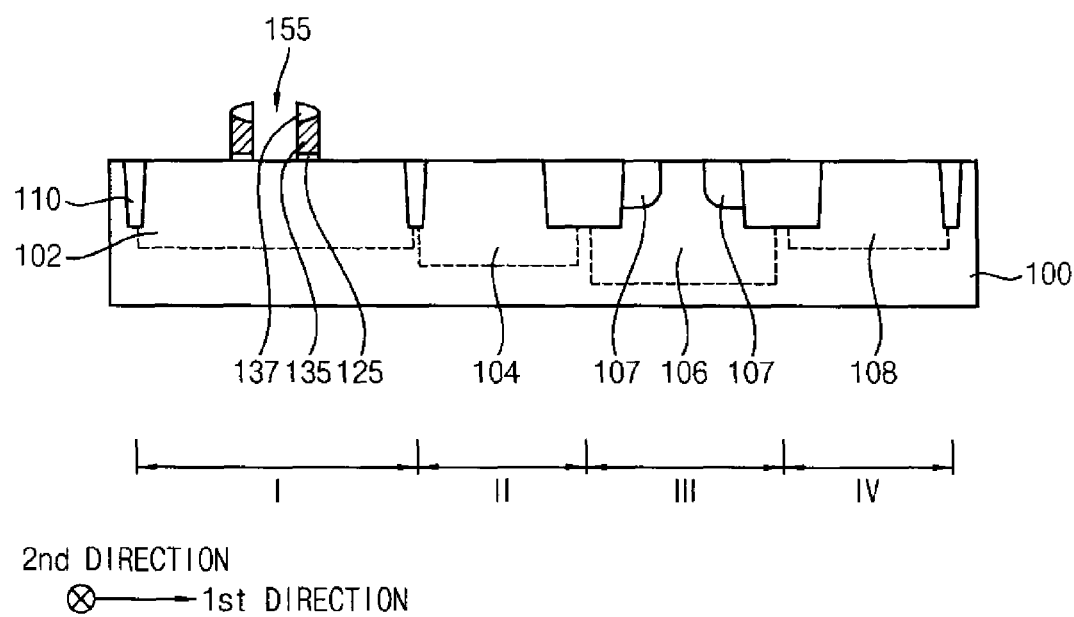

Referring to FIG. 6, the oxide layer 133 may be etched using the first and second masks 140 and 150 as an etching mask to form an oxide layer pattern 137 on the floating gate layer 130. In at least one example embodiment, a pair of oxide layer patterns 137 spaced apart from each other in a first direction substantially parallel to the top surface of the substrate 100 and substantially perpendicular to the second direction may be formed, and inner sidewalls of the oxide layer patterns 137 facing each other may have a vertical length greater than that of outer sidewalls of the oxide layer patterns 137 opposing the inner sidewalls.

After removing the first and second masks 140 and 150, the floating gate layer 130 and the first gate insulation layer 120 may be etched using the oxide layer pattern 137 as an etching mask to form a first gate insulation layer pattern 125 and a floating gate 135 sequentially stacked on the substrate 100 in the first region I. Particularly, a pair of first gate insulation layer patterns 125 spaced apart from each other by a second opening 155 exposing a top surface of the substrate 100, and a pair of floating gates 135 also spaced apart from each other by the second opening 155 may be formed.

Figure 7:
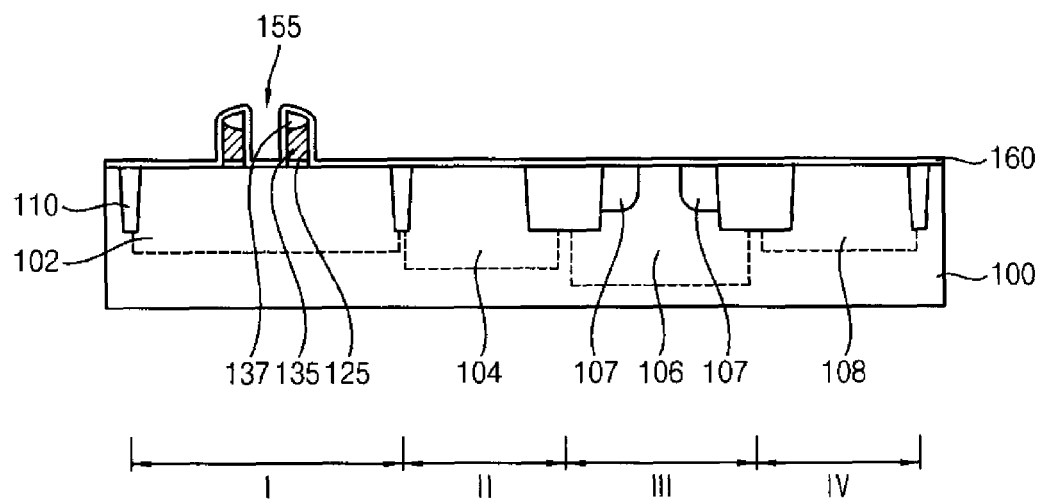

Referring to FIG. 7, a tunnel insulation layer 160 may be formed on the pair of first gate insulation layer patterns 125, the pair of floating gates 135, the pair of oxide layer patterns 137, the substrate 100 and the isolation layer 110.

In at least one example embodiment, the tunnel insulation layer 160 may be formed to include, e.g., silicon oxide.

Figure 8:
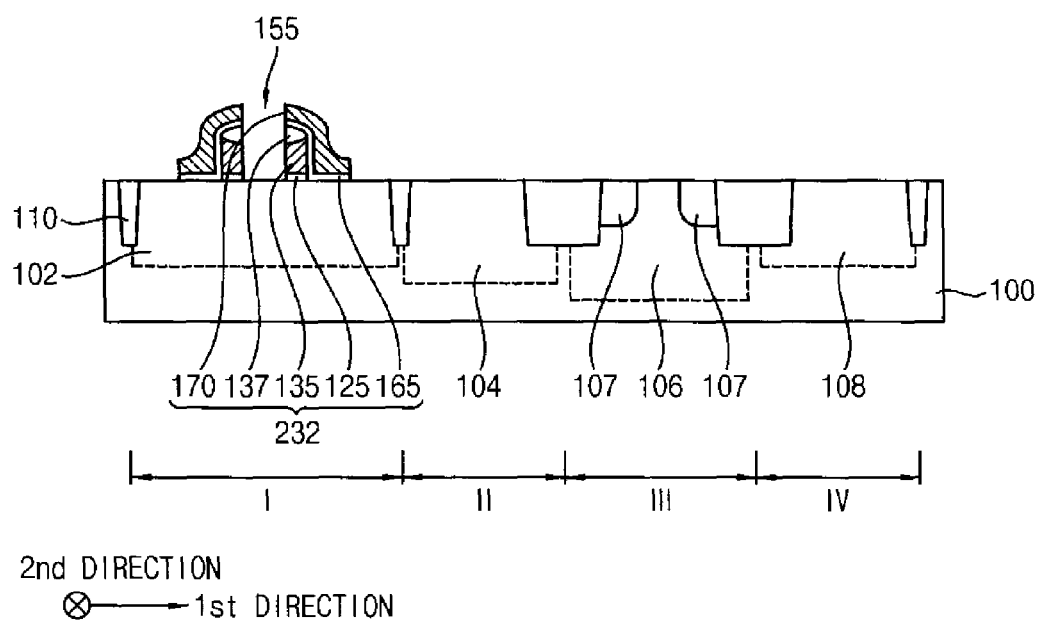

Referring to FIG. 8, a control gate layer may be formed on the tunnel insulation layer 160, and the control gate layer and the tunnel insulation layer 160 may be etched by a photolithography process to form a tunnel insulation layer pattern 165 and a control gate 170 sequentially stacked on the substrate 100 in the first region I. For example, the control gate layer may be formed to include, e.g., doped polysilicon or a metal.

Thus, in the first region I, a first gate structure 232 including the first gate insulation layer pattern 125, the floating gate 135 and the oxide layer pattern 137 sequentially stacked on the substrate 100, and the tunnel insulation layer pattern 165 and the control gate 170 that are sequentially stacked and cover the oxide layer pattern 137, the floating gate 135, the first gate insulation layer pattern 125 and the substrate 100 may be formed. In at least one example embodiment, a pair of first gate structures 232 spaced apart from each other in the first direction may be formed to define a split gate structure. In at least one example embodiment, each first gate structure 232 may extend in the second direction.

Figure 9:
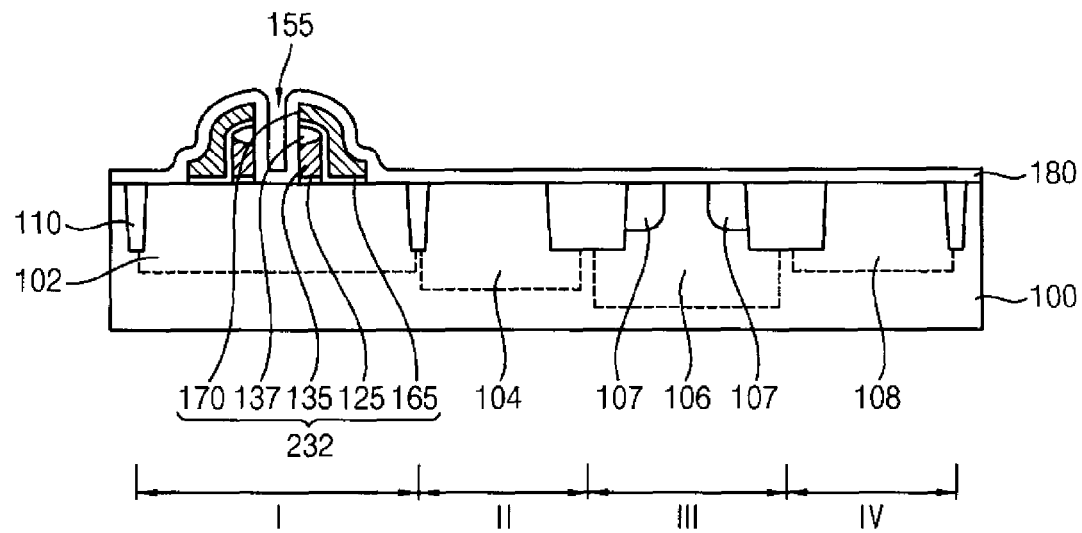

Referring to FIG. 9, a spacer layer 180 may be formed on the split gate structure, the substrate 100 and the isolation layer 110.

The spacer layer 180 may be formed to include, e.g., silicon oxide or silicon nitride. The spacer layer 180 may be formed to have a thickness thicker than those of third and fourth gate insulation layers 190 and 220 (refer to FIGS. 11 and 13).

Figure 10:
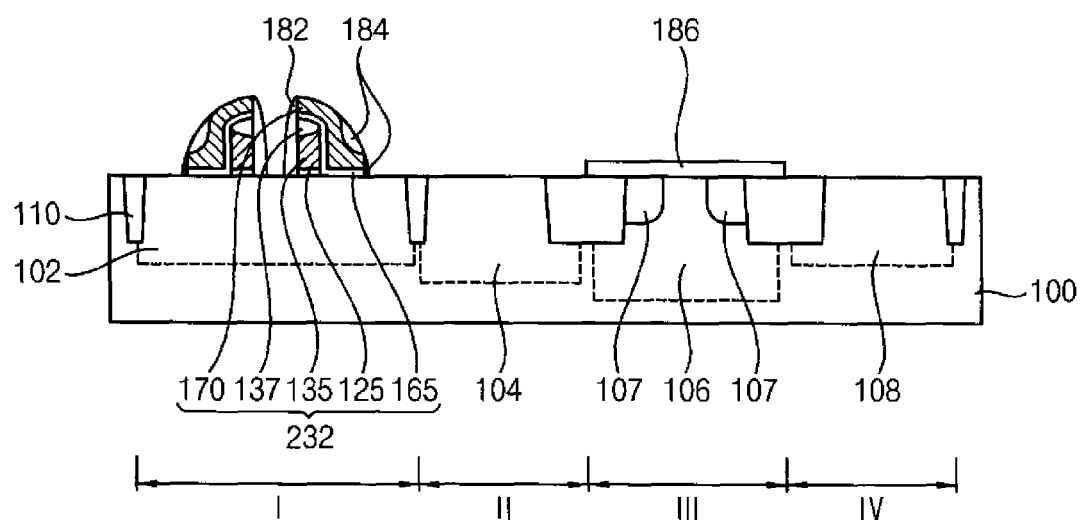

Referring to FIG. 10, a second photoresist pattern (not shown) may be formed to cover a portion of the spacer layer 180 in the third region III, and the spacer layer 180 may be anisotropically etched using the second photoresist pattern as an etching mask to form first and second spacers 182 and 184 and a second gate insulation layer pattern 186 on a sidewall of the split gate structure and on the substrate 100 in the third region III, respectively.

That is, the first spacer 182 may be formed on an inner sidewall of the split gate structure, the second spacer 184 may be formed on an outer sidewall of the split gate structure, and the second gate insulation layer pattern 186 may be formed on the substrate 100 in the third region III.

In at least one example embodiment, the spacer layer 180 may be etched by a dry etching process. If the thick spacer layer 180 is etched by a wet etching process, an etching solution may permeate into the underlying isolation layer 110 so that the spacer layer 180 may not be uniformly etched. However, in accordance with at least one example embodiment, the spacer layer 180 may be dry etched so as to be uniformly etched even though the isolation layer 110 may be over-etched.

Figure 11:
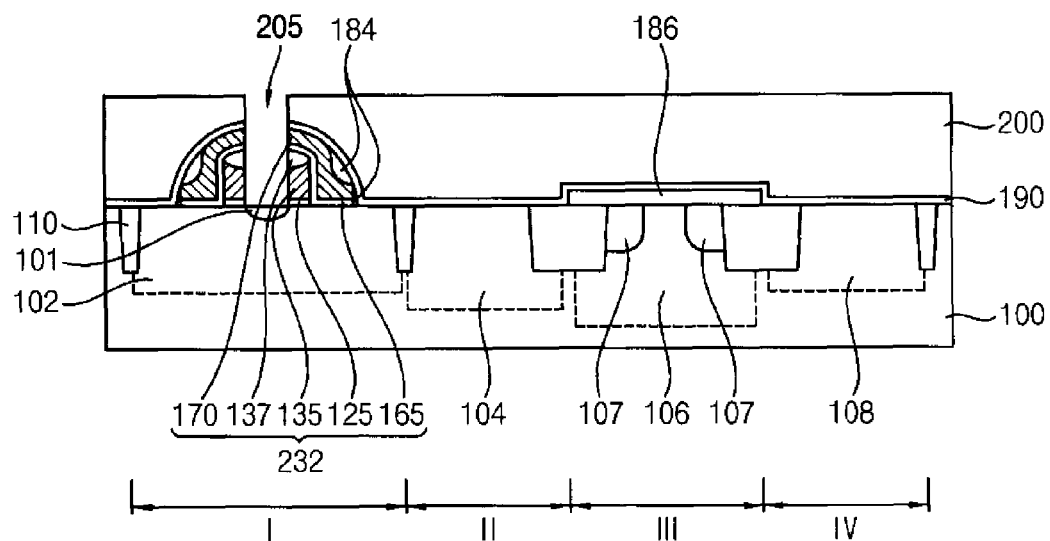

Referring to FIG. 11, a third gate insulation layer 190 may be formed on the split gate structure, the spacers 182 and 184, the second gate insulation layer pattern 186, the substrate 100 and the isolation layer 110, and a third photoresist layer 200 may be formed on the third gate insulation layer 190. The first spacer 182 and the third gate insulation layer 190 may be etched using the third photoresist layer 200 as an etching mask to form a third opening 205 exposing a portion of the substrate 100 in the first region I.

The third gate insulation layer 190 may be formed to include, e.g., silicon oxide. Thus, when the second gate insulation layer pattern 186 includes silicon oxide, the third gate insulation layer 190 and the second gate insulation layer pattern 186 may be merged into one layer.

The third photoresist layer 200 may expose a portion of the third gate insulation layer 190 corresponding to the portion of the substrate 100 between the pair of first gate structures 232 and the first spacer 182, and the exposed portion of the third gate insulation layer 190 may be removed by an etching process. In at least one example embodiment, the etching process may include a wet etching process.

Impurities may be implanted into an upper portion of the substrate 100 exposed by the third opening 205 to form a first impurity region 101 at the upper portion of the substrate 100 between the pair of first gate structures 232. The impurities may be n-type impurities or p-type impurities. That is, n-type impurities may be implanted into the substrate 100 in an NMOS region, and p-type impurities may be implanted into the substrate 100 in a PMOS region.

Figure 12:
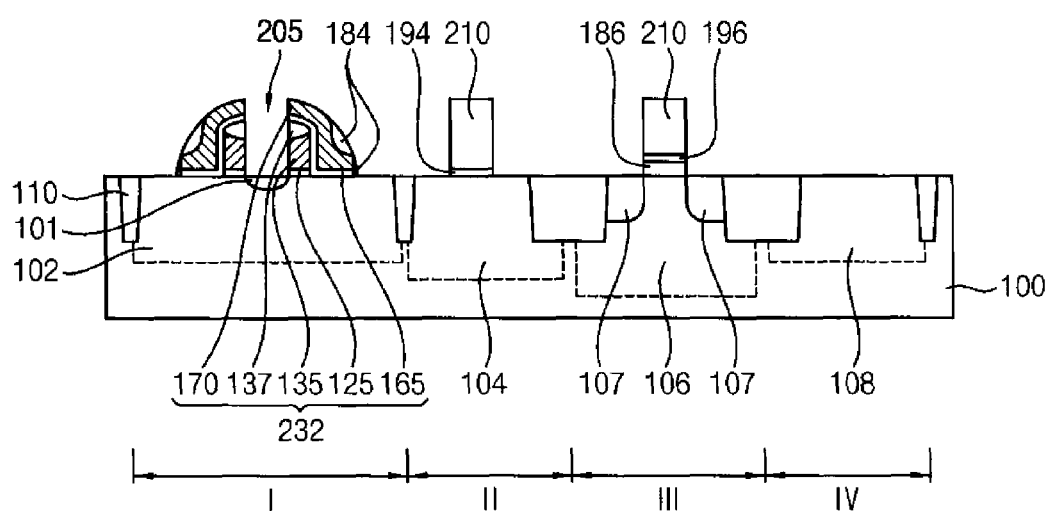

Referring to FIG. 12, the third photoresist layer 200 may be patterned to form a third photoresist pattern 210, and the third gate insulation layer 190 and the second gate insulation layer pattern 186 may be etched using the third photoresist pattern 210 as an etching mask to form third gate insulation layer patterns 194 and 196 in the second and third regions II and III, respectively.

That is, the third photoresist pattern 210 may be formed to cover a portion of the third gate insulation layer 190 in the second region II and a portion of the third gate insulation layer 190 corresponding to a portion of the substrate 100 in the third region III at which the fourth impurity region 107 is not formed. Thus, the third gate insulation layer patterns 194 and 196 may be formed on a portion of the substrate 100 in the second region II and the second gate insulation layer pattern 186.

Figure 13:
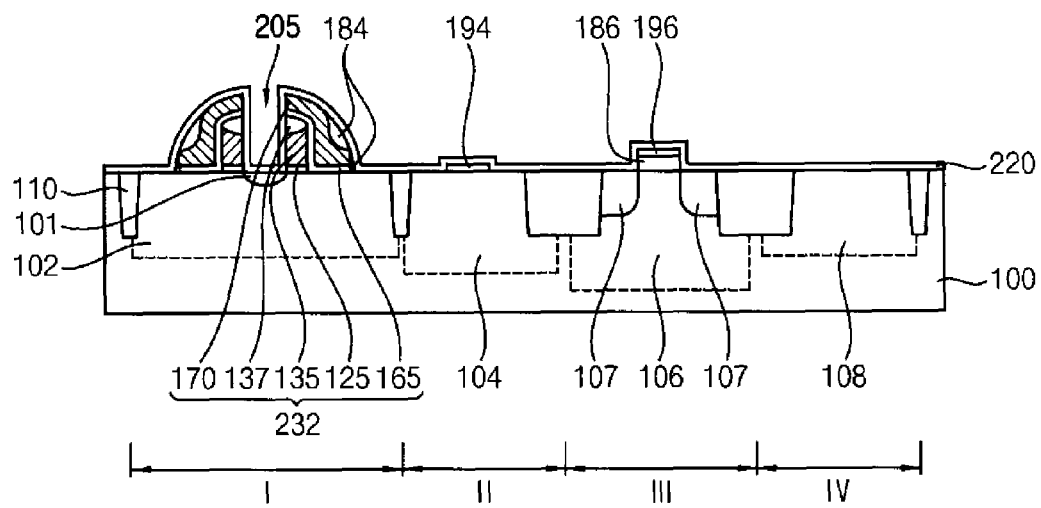

Referring to FIG. 13, after removing the third photoresist pattern 210, a fourth gate insulation layer 220 may be formed on the split gate structure, the second spacer 184, the third gate insulation layer patterns 194 and 196, the substrate 100 and the isolation layer 110.

The fourth gate insulation layer 220 may be formed to include, e.g., silicon oxide. Thus, the fourth gate insulation layer 220 may be merged into the third gate insulation layer patterns 194 and 196, and further may be merged into the second gate insulation layer pattern 186 when the second gate insulation layer pattern 186 includes silicon oxide.

Figure 14:
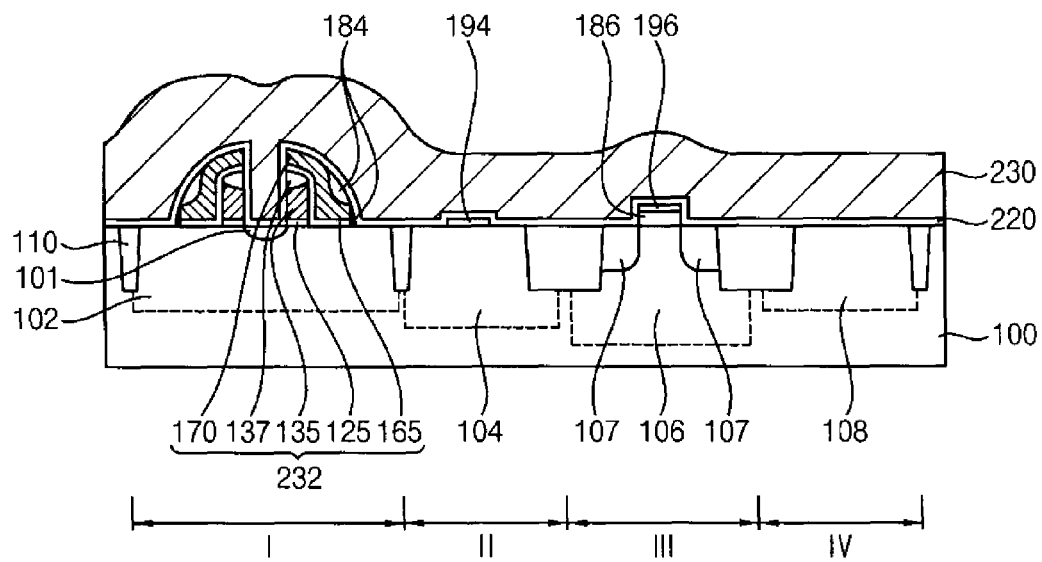

Referring to FIG. 14, a gate electrode layer 230 may be formed on the fourth gate insulation layer 220.

The gate electrode layer 230 may be formed to include, e.g., doped polysilicon or a metal.

Figure 15:
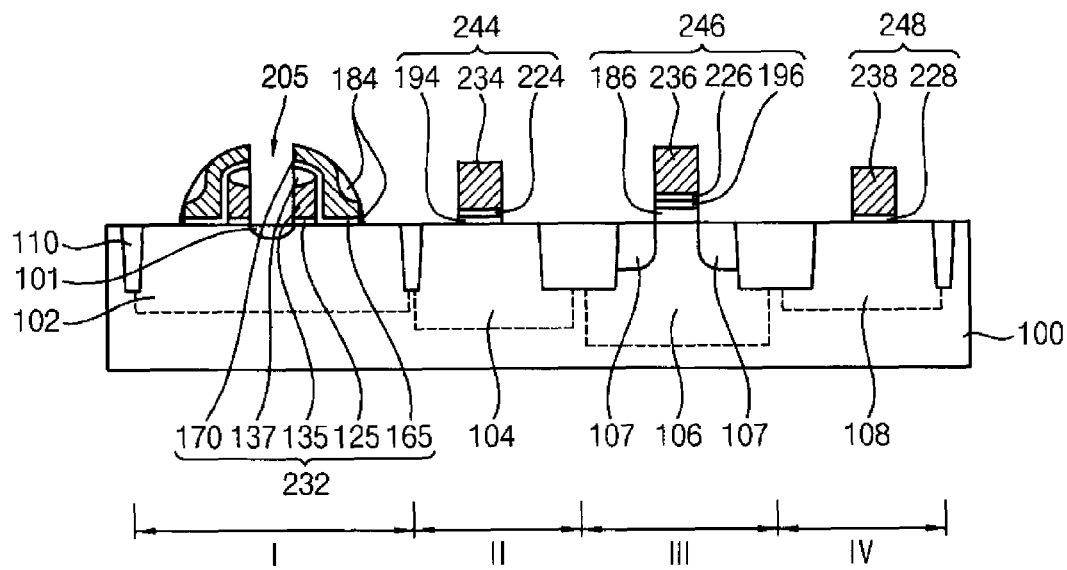

Referring to FIG. 15, after planarizing an upper portion of the gate electrode layer 230, the planarized gate electrode layer 230 and the fourth gate insulation layer 220 may be patterned using a fourth photoresist pattern (not shown) as an etching mask to form gate electrodes 234, 236 and 238 and fourth gate insulation layer patterns 224, 226 and 228.

In at least one example embodiment, the planarization may be performed by a chemical mechanical polishing (CMP) process and/or an etch back process.

The third gate insulation layer pattern 194, the fourth gate insulation layer pattern 224 and the gate electrode 234 sequentially stacked on the substrate 100 in the second region II may be defined as a second gate structure 244, the second gate insulation layer pattern 186, the third gate insulation layer pattern 196, the fourth gate insulation layer pattern 226 and the gate electrode 236 sequentially stacked on the substrate 100 in the third region III may be defined as a third gate structure 246, and the fourth gate insulation layer pattern 228 and the gate electrode 238 sequentially stacked on the substrate 100 in the fourth region IV may be defined as a fourth gate structure 248.

Referring to FIG. 1 again, a fifth photoresist pattern (not shown) covering the pair of first gate structures 232, the portion of the substrate 100 between the pair of first gate structures 232, and the third region III may be formed, and impurities may be implanted into upper portions of the substrate 100 using the fifth photoresist pattern as an ion implantation mask to form second, third and fifth impurity regions 103, 105 and 109. The second impurity region 103 may be formed at an upper portion of the substrate 100 in the first region I adjacent to an outer sidewall of each first gate structure 232, the third impurity region 105 may be formed at an upper portion of the substrate 100 in the second region II adjacent to the second gate structure 244, and the fifth impurity region 109 may be formed at an upper portion of the substrate 100 in the fourth region IV adjacent to the fourth gate structure 248. The second, third and fifth impurity regions 103, 105 and 109 may be formed by doping n-type impurities in an NMOS region or p-type impurities in a PMOS region.

The semiconductor device may be manufactured by the above processes.

As illustrated above, the second, third and fourth gate structures 244, 246 and 248 formed in the second, third and fourth regions II, III and IV of the logic region to which a high voltage, an ultra high voltage and a low voltage may be applied, respectively, may be formed to have gate insulation layer pattern structures having different compositions from one another. That is, when the second, third and fourth gate structures 244, 246 and 248 include second, third and fourth gate insulation layer pattern structures, respectively, the fourth gate insulation layer pattern structure may include only the fourth gate insulation layer pattern 228, the second gate insulation layer pattern structure may include the third and fourth gate insulation layer patterns 194 and 224, and the third gate insulation layer pattern structure may include the second, third and fourth gate insulation layer patterns 186, 196 and 226. Thus, the gate insulation layer pattern structures formed in the second, third and fourth regions II, III and IV, respectively, may be easily formed to have required thicknesses according to the voltages applied thereto.

Particularly, the third gate insulation layer pattern structure formed in the third region III serving as the ultra high voltage region may be formed to have a sufficiently thick thickness using the spacer layer 180 for forming the spacers 182 and 184 on the sidewalls of the split gate structure.

In the present embodiment, the fourth, second and third gate structures 248, 244 and 246 may include the fourth, second and third gate insulation layer pattern structures having single, double and triple layered structures, respectively, however, may not be limited thereto. That is, the fourth, second and third gate layer pattern structures may have more layers than one, two and three layers, respectively, if only the fourth, second and third gate layer pattern structures may have less layers in this order so as to have less thicknesses in this order.

The second gate insulation layer pattern 186, the third gate insulation layer patterns 194 and 196, and the fourth gate insulation layer patterns 224, 226 and 228 may be formed to include substantially the same material as one another so as to be merged into one layer, which may be illustrated with reference to FIG. 16.

Figure 16:
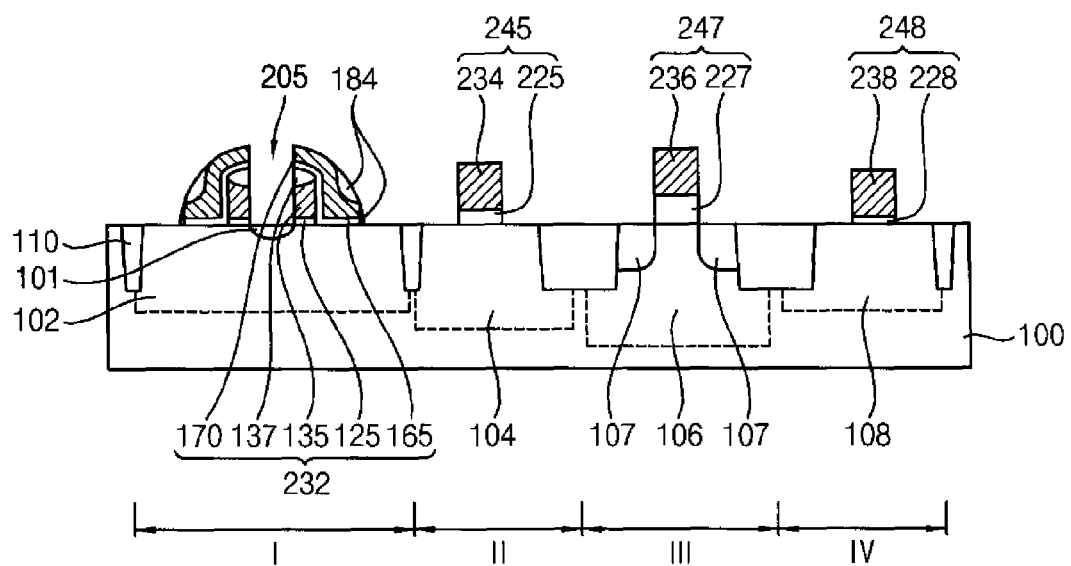

FIG. 16 is a cross-sectional view illustrating a semiconductor device in accordance with at least one example embodiment. This semiconductor device may be substantially the same as that of FIG. 1, except for the gate insulation layer pattern structure. Thus, like reference numerals refer to like elements, and detailed descriptions thereon are omitted herein.

Referring to FIG. 16, the semiconductor device may include a split gate structure, a second spacer 184, and fifth, sixth and fourth gate structures 245, 247 and 248. The semiconductor device may further include first, second, third, fourth and fifth impurity regions 101, 103, 105, 107 and 109.

The fifth gate structure 245 may include a fifth gate insulation layer pattern structure 225 having a first thickness and a gate electrode 234 sequentially stacked on a substrate 100 in a second region II. In at least one example embodiment, the fifth gate insulation layer pattern structure 225 may have a single layer including, e.g., silicon oxide.

The sixth gate structure 247 may include a sixth gate insulation layer pattern structure 227 having a second thickness and a gate electrode 236 sequentially stacked on the substrate 100 in a third region III. The second thickness may be greater than the first thickness. In at least one example embodiment, the sixth gate insulation layer pattern structure 227 may have a single layer including, e.g., silicon oxide.

The fourth gate structure 248 may include a fourth gate insulation layer pattern structure and a gate electrode 238 having a third thickens sequentially stacked on the substrate 100 in the fourth region IV. The fourth gate insulation layer pattern structure may be a fourth gate insulation layer pattern 228 including, e.g., silicon oxide. The third thickness may be less than the first thickness.

Thus, the fifth, sixth and fourth gate structures 245, 247 and 248 formed in the second, third and fourth regions II, III and IV, respectively, may have the fifth, sixth and fourth gate insulation layer pattern structures, respectively, each of which may have a single layer. The fifth, sixth and fourth gate insulation layer pattern structures may include substantially the same material, e.g., silicon oxide, and have different thicknesses from one another. That is, the sixth, fifth and fourth gate insulation layer pattern structures 227, 225 and 228 having the second, first and third thicknesses that are greater in this order, respectively, may be formed in the third, second and fourth regions III, II and IV to which an ultra high voltage, a high voltage and a low voltage are applied, respectively.

Figure 17:
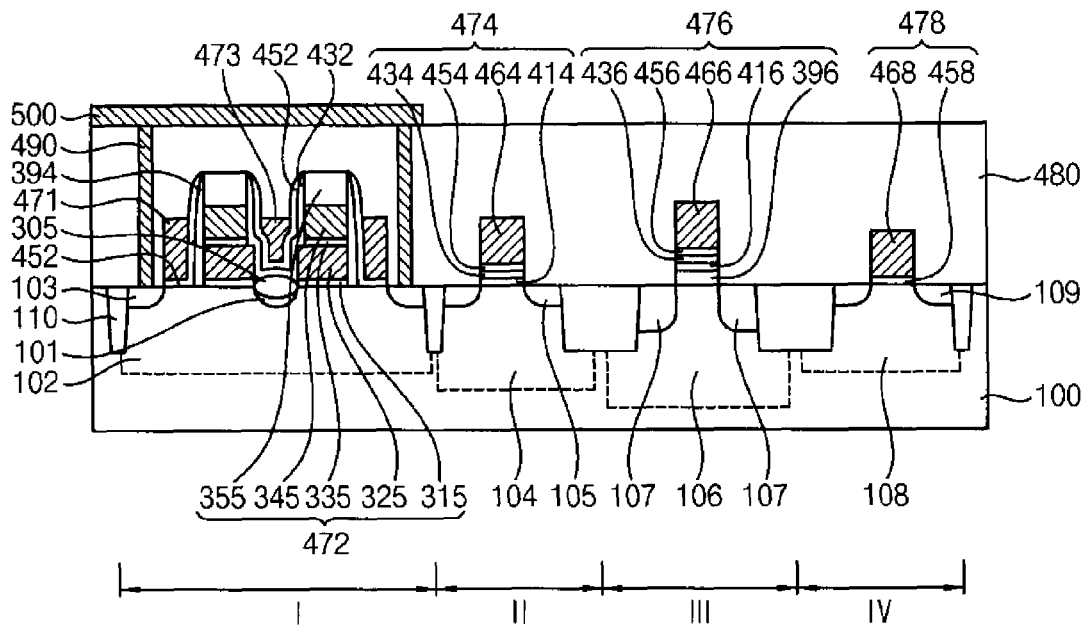
Figure 18:
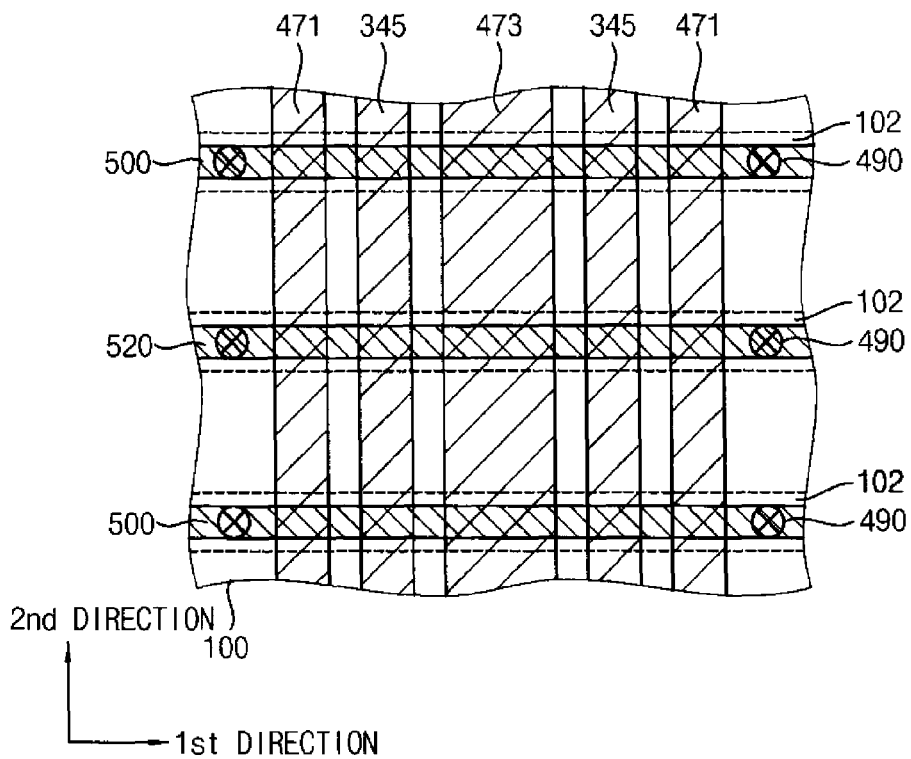

FIG. 17 is a cross-sectional view illustrating a semiconductor device in accordance with at least one example embodiment, and FIG. 18 is a top view illustrating the semiconductor device of FIG. 17. This semiconductor device may have a structure similar to that of the semiconductor device of FIG. 1, and thus detailed descriptions on similar elements are omitted herein.

Referring to FIGS. 17 and 18, the semiconductor device may include a split gate structure, and second, third and fourth gate structures 474, 476 and 478 on a substrate 100. The semiconductor device may further include first, second, third, fourth and fifth impurity regions 101, 103, 105, 107 and 109 and a bit line 500.

The substrate 100 may include first, second, third and fourth regions I, II, III and IV. In at least one example embodiment, the first region I may be a cell region in which memory cells are formed, the second to fourth regions II, III and IV may be a logic region in which logic elements are formed. Particularly, the second region II may be a high voltage region, the third region III may be an ultra high voltage region, and the fourth region IV may be a low voltage region. A voltage less than about 5V may be applied to the low voltage region, a voltage in a range of about 5 to about 15V may be applied to the high voltage region, and a voltage greater than about 15V may be applied to the ultra high voltage region. An isolation layer 110 may be formed on the substrate 100, and thus the substrate 100 may be divided into an active region and a field region.

First, second, third and fourth wells 102, 104, 106 and 108 may be formed at the substrate 100 in the first, second, third and fourth regions I, II, III and IV, respectively. In FIG. 17, the first to fourth regions I, II, III and IV have the first to fourth wells 102, 104, 106 and 108, respectively. Alternatively, each of the first to fourth regions I, II, III and IV may have two wells (not shown) doped with impurities having different conduction types from each other.

In at least one example embodiment, the split gate structure may include a pair of first gate structures 472 on the substrate 100 in the first region I, a first tunnel insulation layer pattern 432 on an inner sidewall of each first gate structure 472 and a portion of the substrate 100 between the pair of first gate structures 272, a second spacer 394 on an outer sidewall of each first gate structure 472, a word line 471 contacting each second spacer 394 on the substrate 100, and an erase gate 473 on the first tunnel insulation layer pattern 432 between the pair of first gate structures 472. The split gate structure may further include a fifth gate insulation layer pattern 452 on the first tunnel insulation layer pattern 432, the second spacer 394, and a portion of the substrate 100 adjacent to the second spacer 394. In this case, each word line 471 may be formed on a portion of the fifth gate insulation layer pattern 452 that may contact the second spacer 394 and the substrate 100, and the erase gate 473 may be formed on a portion of the fifth gate insulation layer pattern 452 that may be formed on the first tunnel insulation layer pattern 432.

In at least one example embodiment, the pair of first gate structures 472 may be spaced apart from each other in a first direction substantially parallel to a top surface of the substrate 100, and each first gate structure 472 may extend in a second direction substantially parallel to the top surface of the substrate 100 and substantially perpendicular to the first direction. Accordingly, each word line 471 and each erase gate 473 may also extend in the second direction.

In at least one example embodiment, each first gate structure 472 may include a first gate insulation layer pattern 315, a floating gate 325, a dielectric layer pattern 335, a control gate 345 and a hard mask 355 sequentially stacked on the substrate 100 in the first region I.

The first gate insulation layer pattern 315 may include, e.g., silicon oxide, and the floating gate 325 may include, e.g., doped polysilicon or a metal. The dielectric layer pattern 335 may include, e.g., silicon oxide and/or silicon nitride. In an example embodiment, the dielectric layer pattern 335 may have a multi-layered structure of an oxide layer/a nitride layer/an oxide layer. The control gate 345 may include, e.g., doped polysilicon or a metal, and the hard mask 355 may include, e.g., silicon nitride.

An oxide layer 305 may be formed on a portion of the substrate 100 between the pair of first gate structures 472, and thus the first tunnel insulation layer pattern 432 may be formed on the oxide layer 305. The oxide layer 305 may include, e.g., silicon oxide. In an example embodiment, the oxide layer 305 may have a convex shape.

The first tunnel insulation layer pattern 432 may include, e.g., silicon oxide, and the second spacer 394 may include, e.g., silicon oxide or silicon nitride. In an example embodiment, the first tunnel insulation layer pattern 432 may have a maximum thickness of about 80 to about 120 Å, and the second spacer 394 may have a maximum thickness of about 300 to about 400 Å.

The word line 471 and the erase gate 473 may include substantially the same material, e.g., doped polysilicon or a metal.

The fifth gate insulation layer pattern 452 may include, e.g., silicon oxide. In an example embodiment, the fifth gate insulation layer pattern 452 may have a thickness of about 10 to about 30 Å.

The first and second impurity regions 101 and 103 may be formed at upper portions of the substrate 100 in the first region I adjacent to the split gate structure. Particularly, the first impurity region 101 may be formed at an upper portion of the substrate 100 between the pair of first gate structures 472, e.g., beneath the oxide layer 305, and the second impurity region 103 may be formed at an upper portion of the substrate 100 adjacent to the outer sidewall of each first gate structure 472.

The second gate structure 474 may include a third gate insulation layer pattern 414, a fourth gate insulation layer pattern 434, a fifth gate insulation layer pattern 454 and a gate electrode 464 sequentially stacked on the substrate 100 in the second region II. The third gate structure 476 may include a second gate insulation layer pattern 396, a third gate insulation layer pattern 416, a fourth gate insulation layer pattern 436, a fifth gate insulation layer pattern 456 and a gate electrode 466 sequentially stacked on the substrate 100 in the third region III. The fourth gate structure 478 may include a fifth gate insulation layer pattern 458 and a gate electrode 468 sequentially stacked on the substrate 100 in the fourth region IV. In an example embodiment, the second gate insulation layer pattern 396 may have a thickness of about 300 to about 400 Å, the third gate insulation layer patterns 414 and 416 may have a thickness of about 40 to about 80 Å, the fourth gate insulation layer patterns 434 and 436 may have a thickness of about 80 to about 100 Å, and the fifth gate insulation layer patterns 454, 456 and 458 may have a thickness of about 10 to about 30 Å.

Thus, the second to fourth gate structures 474, 476 and 478 may have the second to fourth gate insulation layer pattern structures having first to third thicknesses, respectively, and the second, first and third thicknesses may be greater in this order.

In at least one example embodiment, the second gate insulation layer pattern 396 may include a material substantially the same as that of the second spacer 394, and the fourth gate insulation layer patterns 434 and 436 may include a material substantially the same as that of the first tunnel insulation layer pattern 432.

The third impurity region 105 may be formed on at an upper portion of the substrate 100 adjacent to the second gate structure 474, the fourth impurity region 107 may be formed on at an upper portion of the substrate 100 adjacent to the third gate structure 476, and the fifth impurity region 109 may be formed at an upper portion of the substrate 100 in the fourth region IV adjacent to the fourth gate structure 478.

The split gate structure and the second to fourth gate structures 474, 476 and 478 may be covered by an insulating interlayer 480 on the substrate 100. The insulating interlayer 480 may include, e.g., silicon oxide.

The bit line 500 may be formed on the insulating interlayer 480 and contact a bit line contact 490 that may be formed through the insulating interlayer 480 and contact the second impurity region 103. In at least one example embodiment, the bit line 500 may extend in the first direction. The bit line 500 and the bit line contact 490 may include, e.g., a metal, a metal nitride, doped polysilicon, etc.

In FIG. 17, only one split gate structure is formed on the substrate 100 in the first region I, however, a plurality of split gate structures may be formed in the first direction. The bit line contact 490 may be formed between the plurality of split gate structures.

In the semiconductor device in accordance with at least one example embodiment, the second, third and fourth gate structures 474, 476 and 478 in the second, third and fourth regions II, III and IV to which a high voltage, an ultra high voltage and a low voltage, respectively, may be applied may have the gate insulation layer pattern structure having a required thickness according to the voltage applied to each region.

FIGS. 19 to 31 are cross-sectional views illustrating stages of a method of manufacturing a semiconductor device in accordance with at least one example embodiment. This method may be used in manufacturing the semiconductor device of FIGS. 17 and 18, however, may not be limited thereto. This method may include processes substantially the same as or similar to those illustrated with reference to FIGS. 2 to 15, and thus detailed descriptions thereon are omitted herein.

Figure 19:
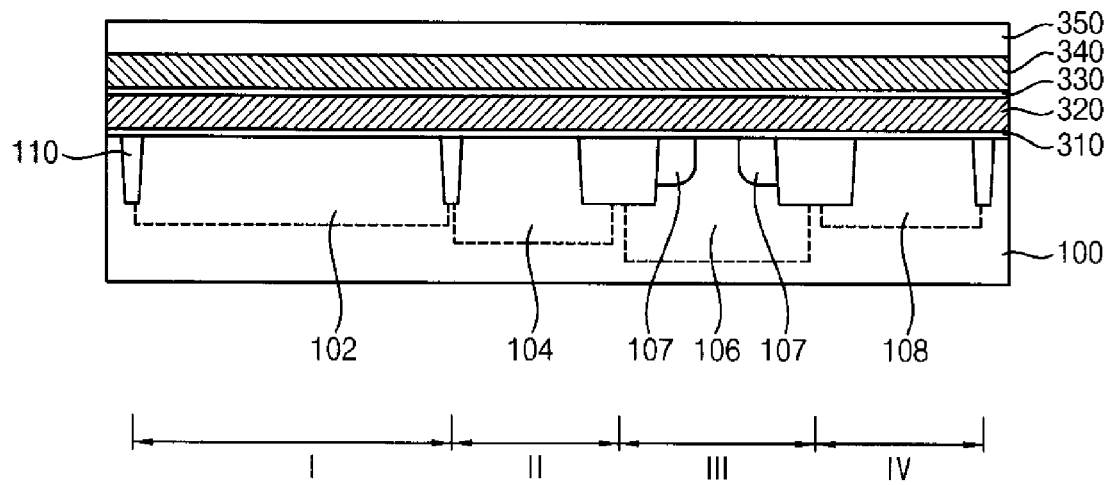

Referring to FIG. 19, a process substantially the same as or similar to that illustrated with reference to FIG. 2 may be performed. That is, an isolation layer 110 may be formed on a substrate 100, and first, second, third and fourth wells 102, 104, 106 and 108 may be formed at first, second, third and fourth regions I, II, III and IV of the substrate 100, respectively. Alternatively, the first to fourth wells 102, 104, 106 and 108 may be formed before forming the isolation layer 110.

Impurities may be implanted into an upper portion of the substrate 100 in the third region III using a first photoresist pattern (not shown) as an ion implantation mask to form a fourth impurity region 107.

A first gate insulation layer 310, a floating gate layer 320, a dielectric layer 330, a control gate layer 340 and a hard mask layer 350 may be sequentially formed on the substrate 100 having the isolation layer 110 thereon.

The first gate insulation layer 310 may be formed to include, e.g., silicon oxide. The floating gate layer 320 may be formed to include, e.g., doped polysilicon or a metal. The dielectric layer 330 may be formed to include, e.g., silicon oxide and/or silicon nitride. In an example embodiment, the dielectric layer 330 may be formed to have a multi-layered structure of an oxide layer/a nitride layer/an oxide layer. The control gate layer 340 may be formed to include, e.g., doped polysilicon or a metal. The hard mask layer 350 may be formed to include, e.g., silicon nitride.

Figure 20:
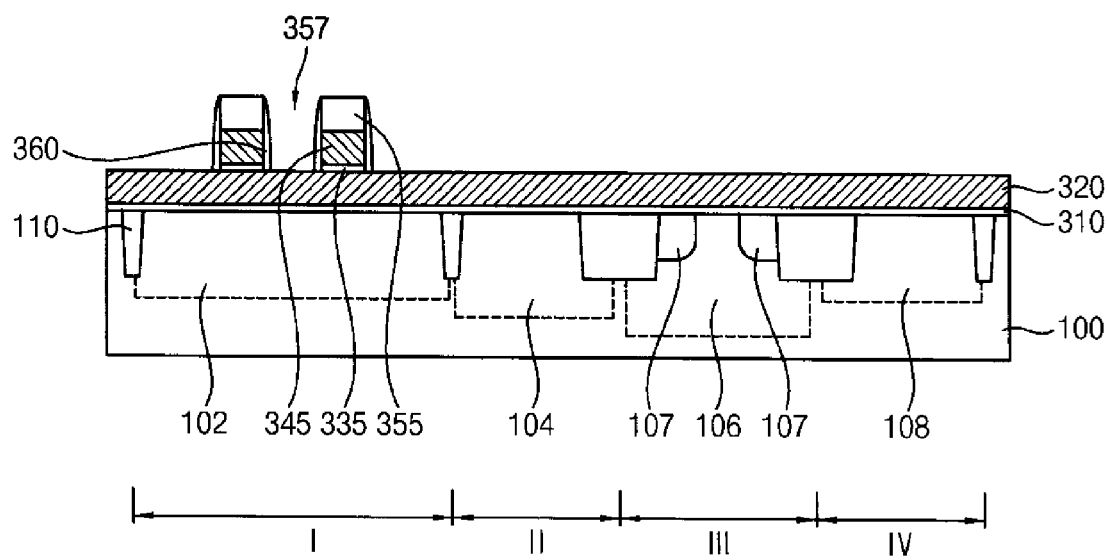

Referring to FIG. 20, the hard mask layer 350 may be etched by a photolithography process to form a hard mask 355. The hard mask 355 may be formed to overlap a portion of the substrate 100 in the first region I. In at least one example embodiment, two hard masks 355 spaced apart from each other in a first direction substantially parallel to a top surface of the substrate 100 may be formed, and each hard mask 355 may extend in a second direction substantially parallel to the top surface of the substrate 100 and substantially perpendicular to the first direction.

The control gate layer 340 and the dielectric layer 330 may be patterned using the hard mask 355 as an etching mask to form a control gate 345 and a dielectric layer pattern 335, respectively. In at least one example embodiment, two control gates 345 spaced apart from each other in the first direction, and two dielectric layer patterns 335 spaced apart from each other in the first direction may be formed, and each control gate 345 and each dielectric layer pattern 335 may extend in the second direction. Thus, a first opening 357 partially exposing the floating gate layer 320 may be formed between a pair of first structures each of which may include the dielectric layer pattern 335, the control gate 345 and the hard mask 355 sequentially stacked.

An offset spacer layer may be formed on the floating gate layer 320 to cover the first structures and anisotropically etched to form an offset spacer 360 on a sidewall of each first structure. The offset spacer layer may be formed to include, e.g., silicon nitride.

Figure 21:
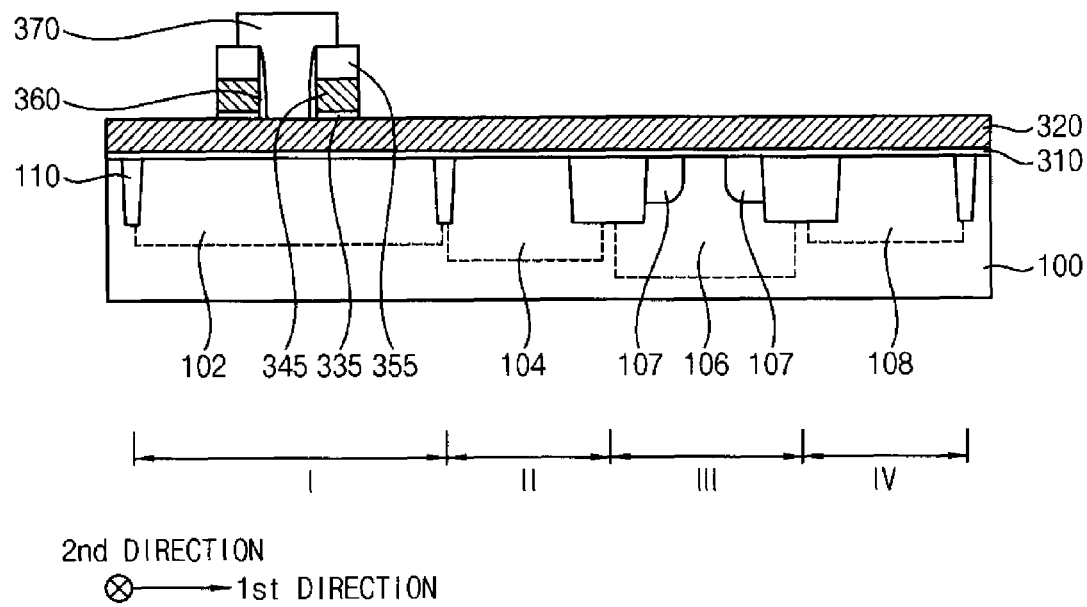

Referring to FIG. 21, a second photoresist pattern 370 covering the first structures and the first opening 357 may be formed, and the offset spacer 360 may be etched using the second photoresist pattern 370 as an etching mask. In at least one example embodiment, the etching process may include a wet etching process. Thus, a portion of the offset spacer 360 on an outer sidewall of each first structure may be removed so that only a portion of the offset spacer 360 on an inner sidewall of each first structure, e.g., a portion of the offset spacer 360 in the first opening 357 may remain.

Figure 22:
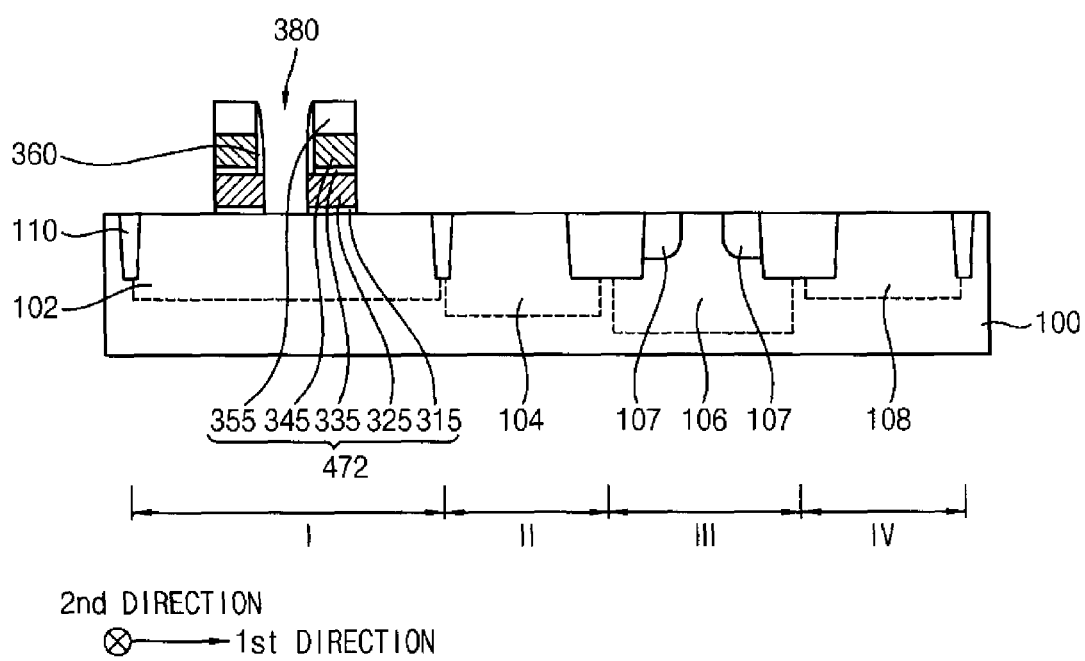

Referring to FIG. 22, after removing the second photoresist pattern 370, the floating gate layer 320 and the first gate insulation layer 310 may be etched using the first structure and the offset spacer 360 as an etching mask. Thus, a first gate insulation layer pattern 315 and a floating gate 325 sequentially stacked may be formed on the substrate 100 in the first region I.

In at least one example embodiment, two first gate insulation layer patterns 315 spaced apart from each other in the first direction and two floating gates 325 spaced apart from each other in the first direction may be formed, and each first gate insulation layer pattern 315 and each floating gate 325 may extend in the second direction.

The first gate insulation layer pattern 315, the floating gate 325, the dielectric layer pattern 335, the control gate 345 and the hard mask 355 sequentially stacked on the substrate 100 in the first region I may define a first gate structure 472. In at least one example embodiment, a pair of first gate structures 472 spaced apart from each other in the first direction by a second opening 380 may be formed on the substrate 100 in the first region I, and each first gate structure 472 may extend in the second direction.

Figure 23:
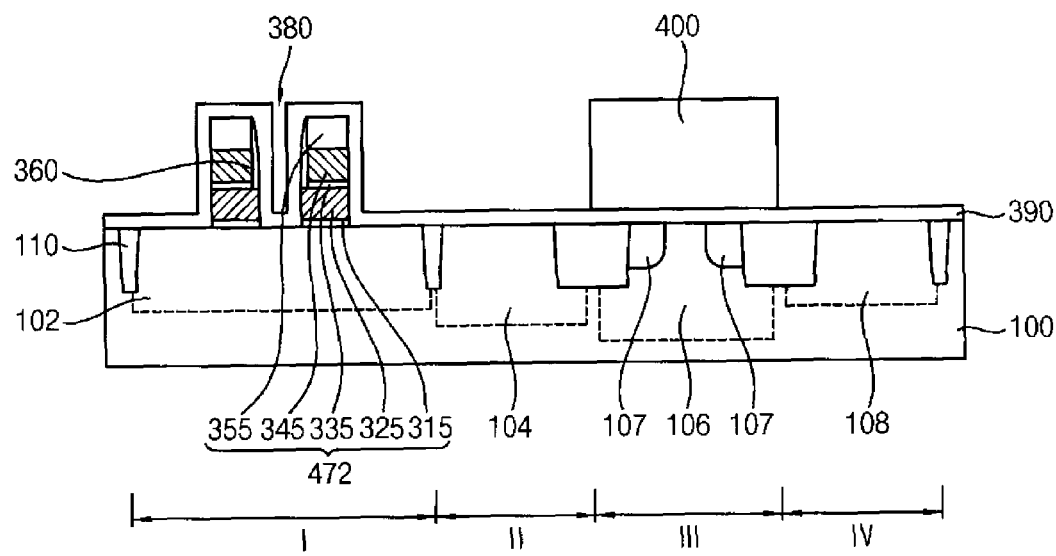

Referring to FIG. 23, a process substantially the same as or similar to that illustrated with reference to FIG. 9 may be performed. That is, a spacer layer 390 may be formed on the first gate structure 472, the offset spacer 360, the substrate 100 and the isolation layer 110.

The spacer layer 390 may be formed to include, e.g., silicon oxide or silicon nitride. When the spacer layer 390 is formed to include silicon oxide, in an example embodiment, the spacer layer 390 may be formed using middle temperature oxide (MTO). The spacer layer 390 may be formed to have a thickness greater than those of third, fourth and fifth gate insulation layers 410, 430 and 450 (refer to FIGS. 25, 27 and 29). In an example embodiment, the spacer layer 390 may be formed to have a thickness of about 300 to about 400 Å.

Figure 24:
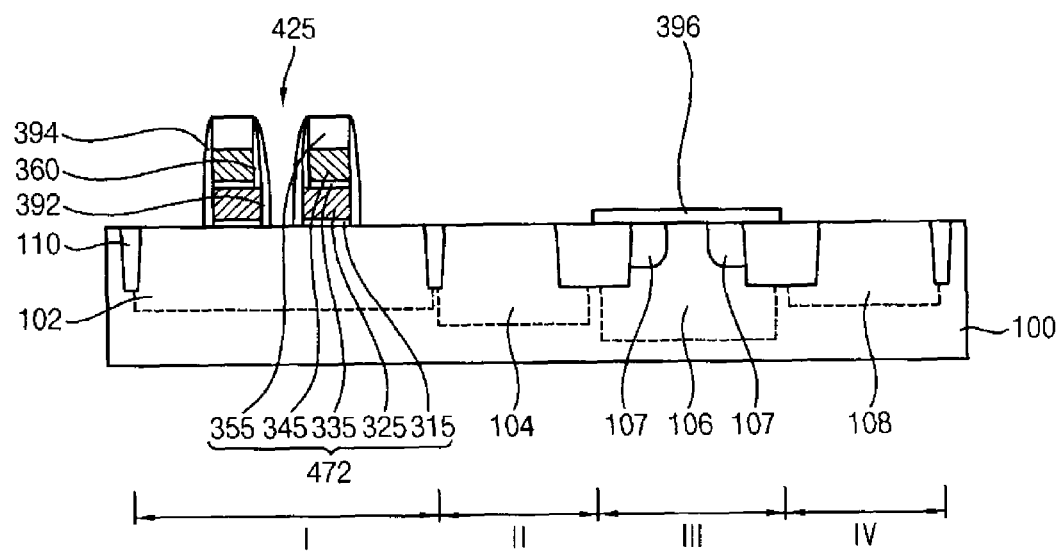

Referring to FIG. 24, a process substantially the same as or similar to that illustrated with reference to FIG. 10 may be performed. That is, a third photoresist pattern (not shown) may be formed to cover a portion of the spacer layer 390 in the third region III, and the spacer layer 390 may be anisotropically etched using the third photoresist pattern as an etching mask to form first and second spacers 392 and 394 and a second gate insulation layer pattern 396 on sidewalls of the first gate structure 472 and the offset spacer 360 and on the substrate 100 in the third region III, respectively.

That is, the first spacer 392 may be formed on an inner sidewall of each second structure including each first gate structure 472 and each offset spacer 360, the second spacer 394 may be formed on an outer sidewall of each second structure, and the second gate insulation layer pattern 396 may be formed on the substrate 100 in the third region III.

Figure 25:
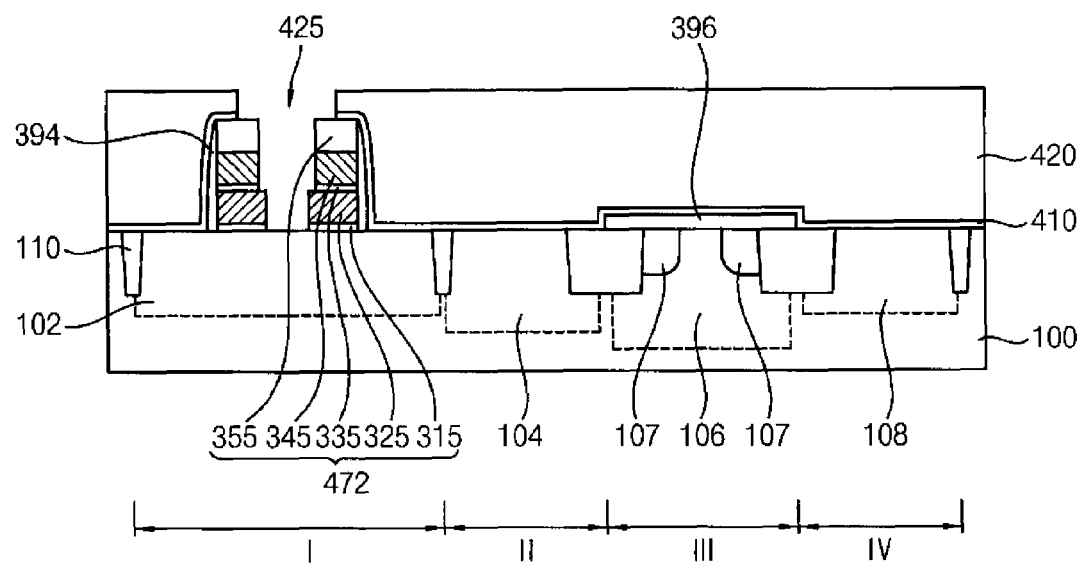

Referring to FIG. 25, a process substantially the same as or similar to that illustrated with reference to FIG. 11 may be performed. That is, a third gate insulation layer 410 may be formed on the second structures, the spacers 392 and 394, the second gate insulation layer pattern 396, the substrate 100 and the isolation layer 110, and a fourth photoresist layer 420 may be formed on the third gate insulation layer 410. The first spacer 392, the offset spacer 360 and the third gate insulation layer 410 may be etched using the fourth photoresist layer 420 as an etching mask to form a third opening 425 exposing a portion of the substrate 100 in the first region I. In at least one example embodiment, the third openings 425 may extend in the second direction.

The third gate insulation layer 410 may be formed to include, e.g., silicon oxide. In an example embodiment, the third gate insulation layer 410 may be formed using rapid thermal oxide (RTO). Thus, when the second gate insulation layer pattern 396 includes silicon oxide, the third gate insulation layer 410 and the second gate insulation layer pattern 396 may be merged into one layer. In an example embodiment, the third gate insulation layer 410 may be formed to have a thickness of about 40 to about 80 Å.

The fourth photoresist layer 420 may expose a portion of the third gate insulation layer 410 corresponding to the portion of the substrate 100 between the pair of first gate structures 472, the first spacer 392 and the offset spacer 360, and the exposed portion of the third gate insulation layer 410 may be removed by an etching process. In at least one example embodiment, the etching process may include a wet etching process.

Figure 26:
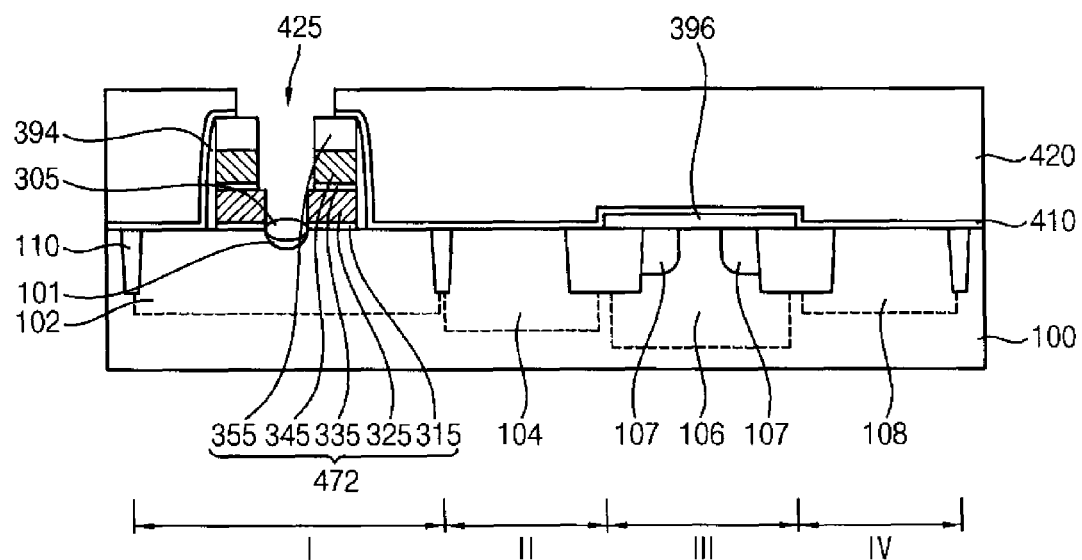

Referring to FIG. 26, impurities may be implanted into an upper portion of the substrate 100 exposed by the third opening 425 to form a first impurity region 101 at the upper portion of the substrate 100 between the pair of first gate structures 472. The impurities may be n-type impurities or p-type impurities. That is, n-type impurities may be implanted into the substrate 100 in an NMOS region, and p-type impurities may be implanted into the substrate 100 in a PMOS region.

A process substantially the same as or similar to those illustrated with reference to FIG. 4 may be performed. That is, the upper portion of the substrate 100 exposed by the third opening 425 may be oxidized to form an oxide layer 305. The oxide layer 305 may extend in the second direction according to the shape of the third opening 425.

In at least one example embodiment, the oxide layer 305 may be formed by a thermal oxidation process on the exposed upper portion of the substrate 100. Alternatively, the oxide layer 305 may be formed by a wet oxidation process using oxygen and hydrogen. In an example embodiment, the oxide layer 305 may be formed to have a convex shape.

Figure 27:
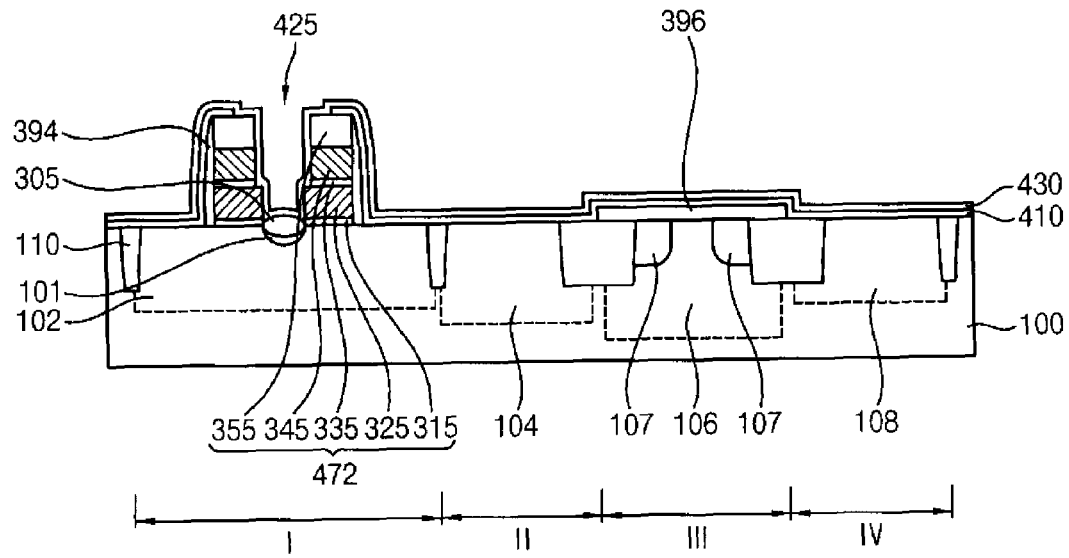

Referring to FIG. 27, after removing the fourth photoresist layer 420, a tunnel insulation layer 430 may be formed on the first gate structures 472, the third gate insulation layer 410 and the oxide layer 405.

The tunnel insulation layer 430 may be formed to include, e.g., silicon oxide. In at least one example embodiment, the tunnel insulation layer 430 may be formed using MTO. The tunnel insulation layer 430 may be merged into the third gate insulation layer 410, or when the second gate insulation layer pattern 396 includes silicon oxide, the tunnel insulation layer 430 may be merged into the second gate insulation layer pattern 396. In an example embodiment, the tunnel insulation layer 430 may be formed to have a thickness of about 80 to about 120 Å.

Figure 28:
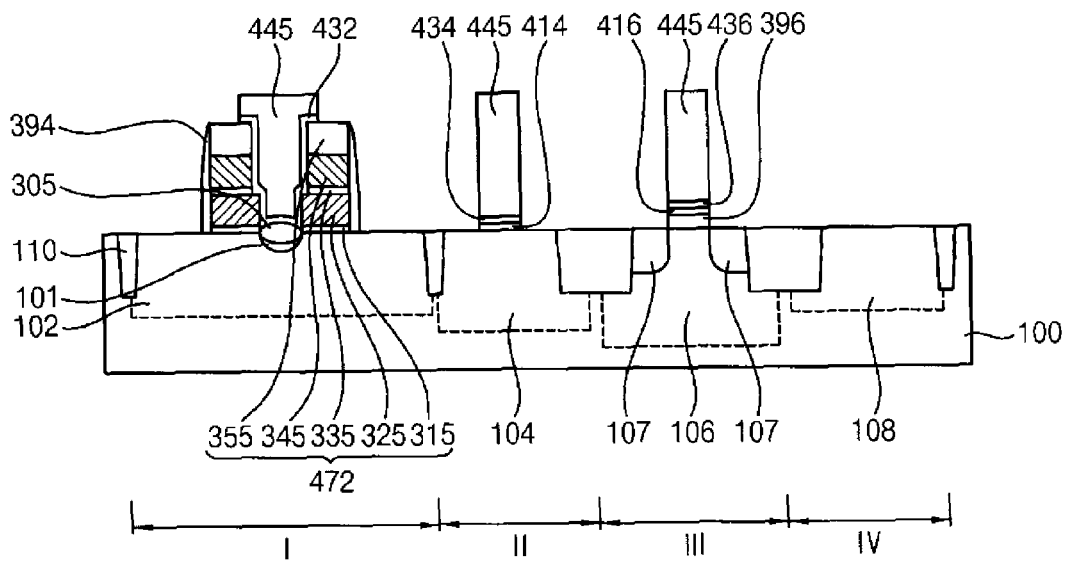

Referring to FIG. 28, a fifth photoresist pattern 445 may be formed on the tunnel insulation layer 430, and the tunnel insulation layer 430, the third gate insulation layer 410 and the second gate insulation layer pattern 396 may be etched using the fifth photoresist pattern 445 as an etching mask.

In at least one example embodiment, the fifth photoresist pattern 445 may be formed to cover a portion of the tunnel insulation layer 430 in the third opening 425 and portions of the tunnel insulation layer 430 in the second and third regions II and III. By the etching process, a first tunnel insulation layer pattern 432 may be formed on the inner sidewall of each first gate structure 472 and the oxide layer 305, third and fourth gate insulation layer patterns 414 and 434 sequentially stacked may be formed on the substrate 100 in the second region II, and second, third and fourth gate insulation layer patterns 396, 416 and 436 sequentially stacked may be formed on the substrate 100 in the third region III. The fourth impurity region 107 may be formed at an upper portion of the substrate 100 in the third region III adjacent to the second, third and fourth gate insulation layer patterns 396, 416 and 436 sequentially stacked.

Figure 29:
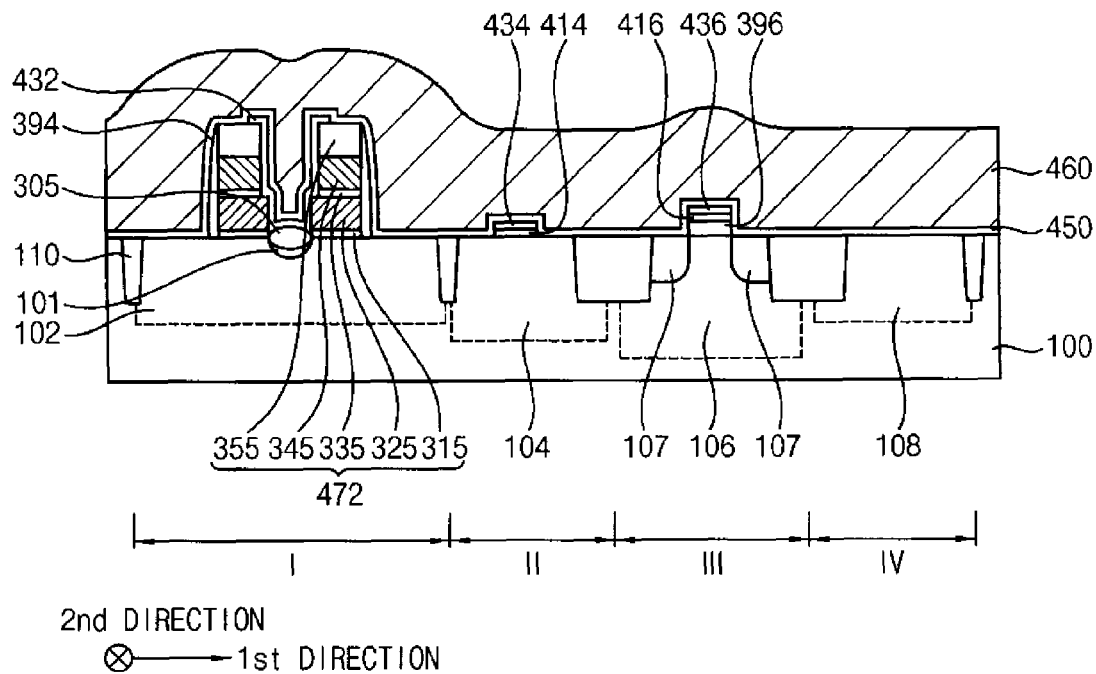

Referring to FIG. 29, processes substantially the same as or similar to those illustrated with reference to FIGS. 13 to 14 may be performed. That is, after removing the fifth photoresist pattern 445, a fifth gate insulation layer 450 and a gate electrode layer 460 may be sequentially formed on the first gate structures 472, the second spacer 394, the first tunnel insulation layer pattern 432, the second gate insulation layer pattern 396, the third gate insulation layer patterns 414 and 416, the fourth gate insulation layer patterns 434 and 436, the substrate 100 and the isolation layer 110.

The fifth gate insulation layer 450 may be formed to include, e.g., silicon oxide. Thus, the fifth gate insulation layer 450 may be merged into the fourth gate insulation layer patterns 434 and 436 and the third gate insulation layer patterns 414 and 416, and further may be merged into the second gate insulation layer pattern 396 when the second gate insulation layer pattern 396 includes silicon oxide. In an example embodiment, the fifth gate insulation layer 450 may be formed to have a thickness of about 10 to about 30 Å.

The gate electrode layer 460 may be formed to include, e.g., doped polysilicon or a metal.

Figure 30:
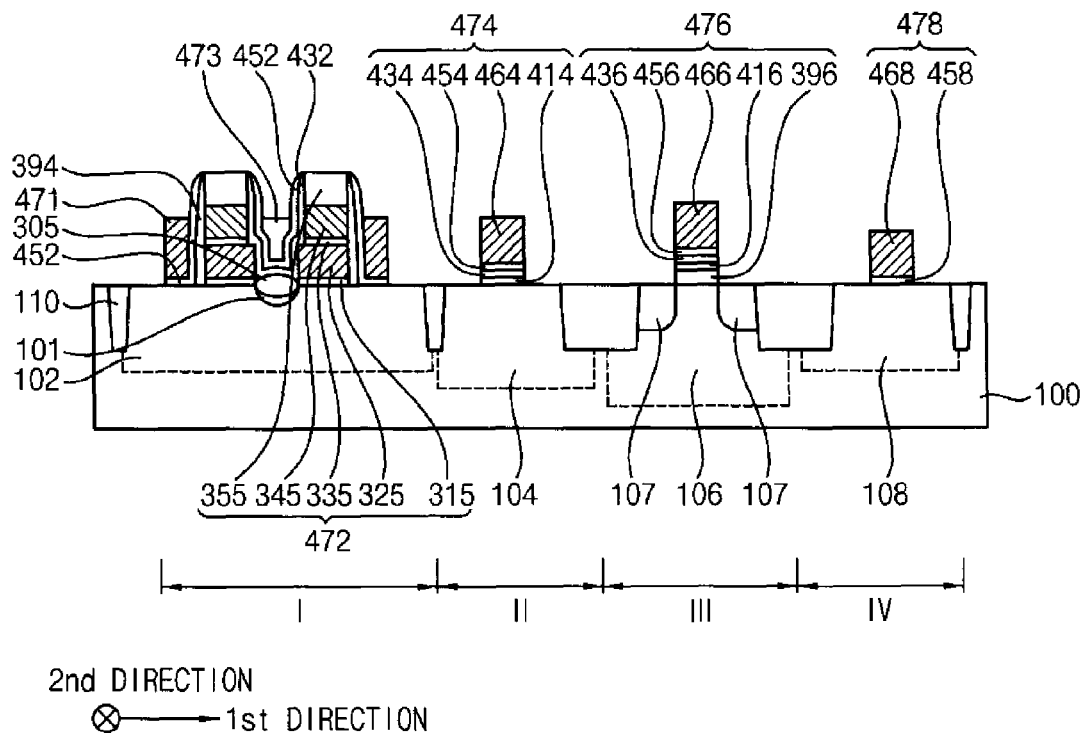

Referring to FIG. 30, a process substantially the same as or similar to that illustrated with reference to FIG. 15 may be performed. That is, after planarizing an upper portion of the gate electrode layer 460, the planarized gate electrode layer 460 and the fifth gate insulation layer 450 may be patterned using a sixth photoresist pattern (not shown) as an etching mask to form a word line 471, an erase gate 473, gate electrodes 464, 466 and 468 and fifth gate insulation layer patterns 454, 456 and 458.

Particularly, the word line 471 may be formed adjacent to the outer sidewall of each first gate structure 472 in the first region I, the erase gate 473 may be formed between the pair of first gate structures 472, and the gate electrodes 464, 466 and 468 may be formed in the second, third and fourth regions II, III and IV, respectively.

Additionally, the fifth gate insulation layer pattern 452 may be formed on the first tunnel insulation layer pattern 432, the second spacer 394 and a portion of the substrate 100 adjacent to the second spacer 394 in the first region I, the fifth gate insulation layer pattern 454 may be formed on the fourth gate insulation layer pattern 434 in the second region II, the fifth gate insulation layer pattern 456 may be formed on the fourth gate insulation layer pattern 436 in the third region III, and the fifth gate insulation layer pattern 458 may be formed on the substrate 100 in the fourth region IV.

In at least one example embodiment, the planarization may be performed by a CMP process and/or an etch back process.

The pair of first gate structures 472 on the substrate 100 in the first region I, the first tunnel insulation layer pattern 432 on the inner sidewall of each first gate structure 472 and the portion of the substrate 100 between the pair of first gate structures 472, the second spacer 394 on the outer sidewall of each first gate structure 472, the word line 471 adjacent to the second spacer 394 on the substrate 100, and the erase gate 473 on the first tunnel insulation layer pattern 432 between the pair of first gate structures 472 may define a split gate structure. In at least one example embodiment, like each first gate structure 472, each word line 471 and each erase gate 473 may extend in the second direction, and thus the split gate structure may extend in the second direction.

The third gate insulation layer pattern 414, the fourth gate insulation layer pattern 434, the fifth gate insulation layer pattern 454 and the gate electrode 464 sequentially stacked on the substrate 100 in the second region II may be defined as a second gate structure 474, the second gate insulation layer pattern 396, the third gate insulation layer pattern 416, the fourth gate insulation layer pattern 436, the fifth gate insulation layer pattern 456 and the gate electrode 466 sequentially stacked on the substrate 100 in the third region III may be defined as a third gate structure 476, and the fifth gate insulation layer pattern 458 and the gate electrode 468 sequentially stacked on the substrate 100 in the fourth region IV may be defined as a fourth gate structure 478.

Figure 31:
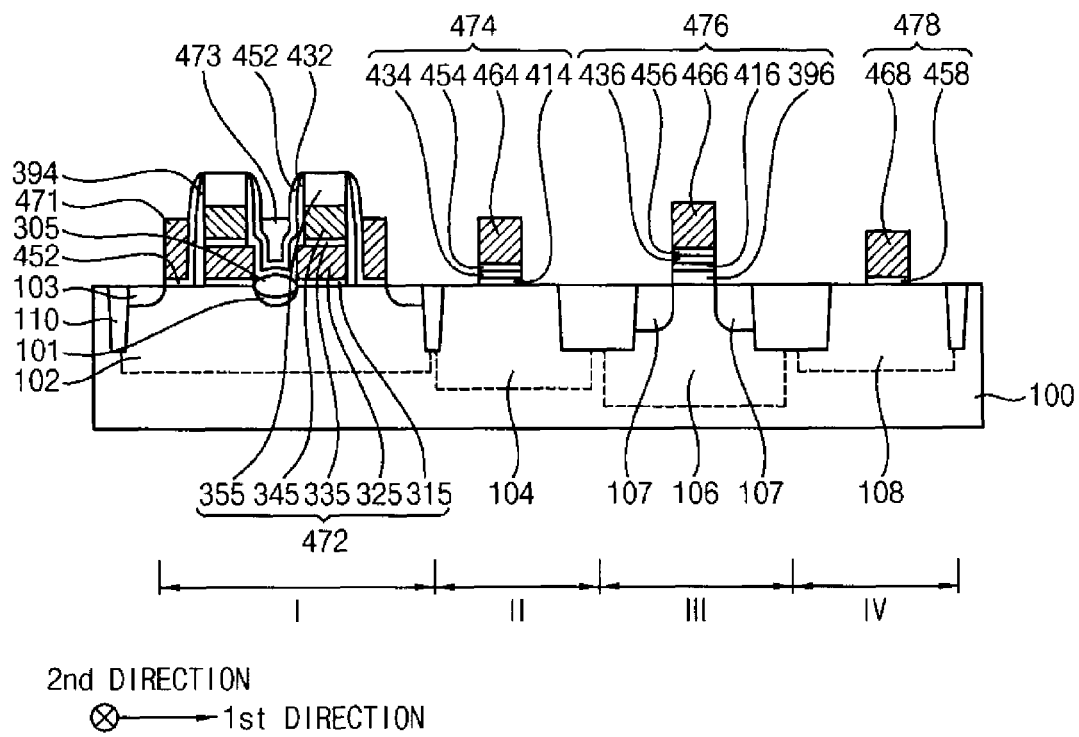

Referring to FIG. 31, a process substantially the same as or similar to that illustrated with reference to FIG. 1 may be performed. That is, a seventh photoresist pattern (not shown) covering the split gate structure, the third gate structure 476 and a portion of the substrate 100 in third region III may be formed, and impurities may be implanted into upper portions of the substrate 100 using the seventh photoresist pattern as an ion implantation mask to form second, third and fifth impurity regions 103, 105 and 109. The second impurity region 103 may be formed at an upper portion of the substrate 100 in the first region I adjacent to an outer sidewall of the split gate structure, the third impurity region 105 may be formed at an upper portion of the substrate 100 in the second region II adjacent to the second gate structure 474, and the fifth impurity region 109 may be formed at an upper portion of the substrate 100 in the fourth region IV adjacent to the fourth gate structure 478. The second, third and fifth impurity regions 103, 105 and 109 may be formed by doping n-type impurities in an NMOS region or p-type impurities in a PMOS region.

Referring to FIGS. 17 and 18 again, after removing the seventh photoresist pattern, an insulating interlayer 480 may be formed on the split gate structure and the second to fourth gate structures 474, 476 and 478. A bit line contact 490 may be formed through the insulating interlayer 480 to contact the second impurity region 103. The insulating interlayer 480 may be formed to include, e.g., silicon oxide, and the bit line contact 490 may be formed to include, e.g., a metal, a metal nitride, doped polysilicon, etc.

A bit line 500 may be formed on the insulating interlayer 480 to contact the bit line contact 490. The bit line 500 may be formed to include, e.g., a metal, a metal nitride, doped polysilicon, etc. In at least one example embodiment, the bit line 500 may be formed to extend in the first direction, and a plurality of bit lines 500 may be formed in the second direction. When the bit line 500 is formed, wirings (not shown) may be also formed in the second to fourth regions II, III and IV.

By the above processes, the semiconductor device may be manufactured.

As illustrated above, the second, third and fourth gate structures 474, 476 and 478 formed in the second, third and fourth regions II, III and IV of the logic region to which a high voltage, an ultra high voltage and a low voltage may be applied, respectively, may be formed to have gate insulation layer pattern structures having different compositions from one another. Thus, the gate insulation layer pattern structures formed in the second, third and fourth regions II, III and IV, respectively, may be easily formed to have required thicknesses according to the voltages applied thereto.

Particularly, the third gate insulation layer pattern structure formed in the third region III serving as the ultra high voltage region may be formed to have a sufficiently thick thickness using the spacer layer 390 for forming the spacers 392 and 394 on the sidewalls of the split gate structure.

In the present embodiment, the fourth, second and third gate insulation layer pattern structures having single, triple and quadruple layered structures, respectively, however, may not be limited thereto. That is, the fourth, second and third gate layer pattern structures may have more or less layers than one, three and four layers, respectively, if only the fourth, second and third gate layer pattern structures may have less layers in this order so as to have less thicknesses in this order.

The second gate insulation layer pattern 396, the third gate insulation layer patterns 414 and 416, the fourth gate insulation layer patterns 434 and 436, and the fifth gate insulation layer patterns 454, 456 and 458 may be formed to include substantially the same material as one another, e.g., silicon oxide so as to be merged into one layer. Additionally, the fifth gate insulation layer pattern 452 may be formed to include substantially the same material as that of the second spacer 394 or the first tunnel insulation layer pattern 432, e.g., silicon oxide so as to be merged thereinto. These may be illustrated with reference to FIG. 32.

Figure 32:
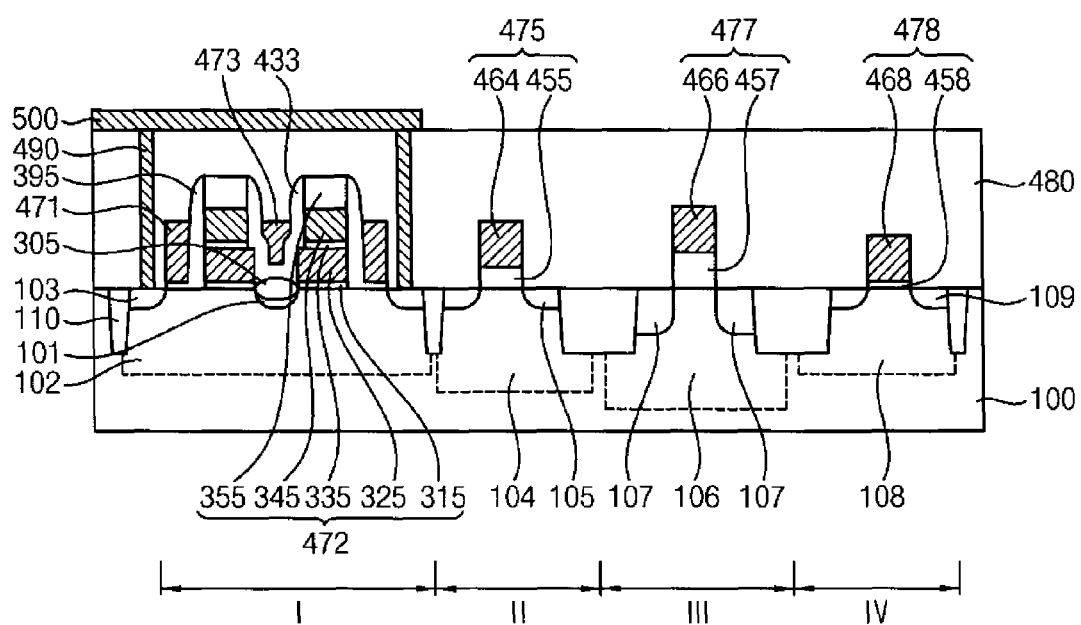

FIG. 32 is a cross-sectional view illustrating a semiconductor device in accordance with at least one example embodiment. This semiconductor device may be substantially the same as that of FIGS. 17 and 18, except for the gate insulation layer pattern structure. Thus, like reference numerals refer to like elements, and detailed descriptions thereon are omitted herein.

Referring to FIG. 32, the semiconductor device may include a split gate structure, and fifth, sixth and fourth gate structures 475, 477 and 478 on a substrate 100. The semiconductor device may further include first, second, third, fourth and fifth impurity regions 101, 103, 105, 107 and 109 and a bit line 500.

The split gate structure may include a pair of first gate structures 472 on the substrate 100 in a first region I, a second tunnel insulation layer pattern 433 on an inner sidewall of each first gate structure 472 and a portion of the substrate 100 between the pair of first gate structures 272, a third spacer 395 on an outer sidewall of each first gate structure 472 and a portion of the substrate 100 adjacent to each first gate structure 472, a word line 471 contacting each third spacer 395, and an erase gate 473 on the second tunnel insulation layer pattern 433 between the pair of first gate structures 472. The second tunnel insulation layer pattern 433 and the third spacer 395 may include, e.g., silicon oxide.

The fifth gate structure 475 may include a fifth gate insulation layer pattern structure 455 having a first thickness and a gate electrode 464 sequentially stacked on the substrate 100 in the second region II. In at least one example embodiment, the fifth gate insulation layer pattern structure 455 may have a single layer including, e.g., silicon oxide. The sixth gate structure 477 may include a sixth gate insulation layer pattern structure 457 having a second thickness and a gate electrode 466 sequentially stacked on the substrate 100 in the third region III. The second thickness may be greater than the first thickness. In at least one example embodiment, the sixth gate insulation layer pattern structure 457 may have a single layer including, e.g., silicon oxide. The fourth gate structure 478 may include a fourth gate insulation layer pattern structure having a third thickness and a gate electrode 468 sequentially stacked on the substrate 100 in the fourth region IV, and the fourth gate insulation layer pattern structure may be a fifth gate insulation layer pattern 458 including, e.g., silicon oxide. The third thickens may be less than the first thickness.

Thus, the fifth, sixth and fourth gate structures 475, 477 and 478 may have the fifth, sixth and fourth gate insulation layer pattern structures each of which may have a single layer, and the fifth, sixth and fourth gate insulation layer pattern structures may include substantially the same material, e.g., silicon oxide. That is, the sixth, fifth and fourth gate insulation layer pattern structures having the second, first and third thicknesses, respectively, which may be higher in this order, may be formed in the second, third and fourth regions II, III and IV to which a high voltage, an ultra high voltage and a low voltage, respectively.

The above semiconductor devices and the methods of manufacturing the semiconductor devices may be applied to various types of semiconductor devices having a split gate structure, e.g., non-volatile memory devices such as flash memory devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive concepts. Accordingly, all such modifications are intended to be included within the scope of the inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, comprising:
    forming a split gate structure on a cell region of a substrate, the substrate including the cell region in which memory cells are formed and a logic region in which logic elements are formed, the logic region having a high voltage region, an ultra high voltage region and a low voltage region, and the split gate structure including a first gate insulation layer pattern, a floating gate, a tunnel insulation layer pattern and a control gate;
    forming a spacer layer on the split gate structure and the substrate;
    etching the spacer layer to form a spacer and a second gate insulation layer pattern, the spacer being formed on a sidewall of the split gate structure and the second gate insulation layer pattern being formed on the ultra high voltage region of the substrate; and
    forming a gate electrode on the high voltage region, the second gate insulation layer pattern, and the low voltage region.

2. The method of claim 1, wherein prior to forming the gate electrode, the method further includes,
    forming a third gate insulation layer pattern on the high voltage region and the second gate insulation layer pattern.

3. The method of claim 2, wherein after forming the third gate insulation layer pattern, the method further includes,
    forming a fourth gate insulation layer pattern on the third gate insulation layer pattern in the high voltage region, the third gate insulation layer pattern in the ultra high voltage region, and the low voltage region.

4. The method of claim 1, wherein the forming the split gate structure comprises:
    sequentially forming a first gate insulation layer and a floating gate layer on the substrate;
    patterning the floating gate layer and the first gate insulation layer to form the first gate insulation layer pattern and the floating gate stacked sequentially on the cell region of the substrate;
    sequentially forming a tunnel insulation layer and a control gate layer on the substrate to cover the first gate insulation layer pattern and the floating gate; and
    patterning the control gate layer and the tunnel insulation layer.

5. The method of claim 4, wherein the patterning the floating gate layer and the first gate insulation layer comprises:
    forming a first mask on the floating gate layer, a portion of the floating gate layer overlapping the cell region of the substrate being exposed through the first mask;
    oxidizing the exposed portion of the floating gate layer to form an oxide layer;
    forming a second mask on a sidewall of the first mask to partially cover the oxide layer;
    etching the oxide layer using the second mask as an etching mask to form an oxide layer pattern;
    removing the first and second masks; and
    etching the floating gate layer and the first gate insulation layer using the oxide layer pattern as an etching mask.

6. The method of claim 4, wherein prior to sequentially forming the first gate insulation layer and the floating gate layer, the method further includes,
    doping impurities at an upper portion of the substrate in the ultra high voltage region.

7. The method of claim 1, wherein the forming the gate electrode comprises:
    forming a gate electrode layer on the split gate structure, the spacer, the second gate insulation layer pattern and the substrate; and
    patterning the gate electrode layer.

8. The method of claim 1, wherein the first gate insulation layer pattern, the tunnel insulation layer pattern and the spacer layer include silicon oxide, and the floating gate, the control gate and the gate electrode include doped polysilicon.

9. A method of manufacturing a semiconductor device, the method comprising:
    forming a pair of first gate structures on a cell region of a substrate, the substrate including the cell region in which memory cells are formed and a logic region in which logic elements are formed, the logic region having a high voltage region, an ultra high voltage region and a low voltage region, and each of the first gate structures including a first gate insulation layer pattern, a floating gate, a dielectric layer pattern, a control gate and a hard mask;
    forming a spacer layer on the pair of first gate structures and the substrate;
    etching the spacer layer to form a spacer and a second gate insulation layer pattern, the spacer being formed on a sidewall of each of the first gate structures, and the second gate insulation layer pattern being formed on the ultra high voltage region of the substrate;
    forming a tunnel insulation layer on the pair of first gate structures, the spacer, the second gate insulation layer pattern and the substrate;
    etching the tunnel insulation layer to form a tunnel insulation layer pattern and a third gate insulation layer pattern, the tunnel insulation layer pattern being formed on an inner sidewall of each of the first gate structures and a portion of the substrate between the pair of first gate structures, and the third gate insulation layer pattern being formed on the high voltage region of the substrate and on the second gate insulation layer pattern;
    forming a word line on an outer sidewall of each of the first gate structures; and
    forming a gate electrode on the third gate insulation layer pattern and on the low voltage region of the substrate.

10. The method of claim 9, wherein prior to forming the word line and the gate electrode, the method further includes,
    forming a fourth gate insulation layer pattern on the third gate insulation layer pattern.

11. The method of claim 10, wherein after forming the fourth gate insulation layer pattern, the method further includes, forming a fifth gate insulation layer pattern on the tunnel insulation layer pattern, the fourth gate insulation layer pattern, and the low voltage region of the substrate.

12. The method of claim 9, wherein prior to forming the tunnel insulation layer, the method further includes,
    removing a portion of the spacer from an inner sidewall of each of the first gate structures,
    forming an impurity region at an upper portion of the substrate between the pair of first gate structures, and
    thermally oxidizing an upper portion of the impurity region to form an oxide layer.

13. The method of claim 9, wherein prior to forming the pair of first gate structures, the method further includes,
    doping impurities at an upper portion of the substrate in the ultra high voltage region.

14. A method of manufacturing a semiconductor device, the method comprising:
    forming a split gate structure on a cell region of a substrate including the cell region and a logic region, the split gate structure including a first gate insulation layer pattern, a floating gate, and a control gate that are stacked sequentially;
    concurrently forming a spacer and a second gate insulation layer pattern, the spacer being formed on a sidewall of the split gate structure, and the second gate insulation layer pattern being formed on an ultra high voltage portion of the logic region; and
    forming a gate electrode on a high voltage portion of the logic region, the second gate insulation layer pattern, and a low voltage portion of the logic region.

15. The method of claim 14, further comprising:
    forming a third gate insulation layer pattern on the high voltage portion of the logic region and on the second gate insulation layer pattern on the ultra high voltage portion of the logic region.

16. The method of claim 15, further comprising:
    forming a fourth gate insulation layer pattern on the third gate insulation layer pattern on the high voltage portion of the logic region, the third gate insulation layer pattern on the ultra high voltage portion of the logic region, and on the low voltage portion of the logic region.

17. The method of claim 14, wherein the forming the split gate structure comprises:
    forming a pair of first gate structures on the cell region of the substrate, each of the first gate structures including the first gate insulation layer pattern, the floating gate, a dielectric layer pattern, the control gate and a hard mask.

18. The method of claim 14, wherein the concurrently forming the spacer layer and the second gate insulation layer pattern comprises:
    forming a spacer layer on the split gate structure and the substrate; and
    concurrently etching the spacer layer to form the spacer and the second gate insulation layer pattern.

* * * * *